United States Patent
Pessoa et al.

(10) Patent No.: US 7,599,432 B2
(45) Date of Patent: Oct. 6, 2009

(54) METHOD AND APPARATUS FOR DYNAMICALLY INSERTING GAIN IN AN ADAPTIVE FILTER SYSTEM

(75) Inventors: Lucio F. C. Pessoa, Cedar Park, TX (US); Roman A. Dyba, Austin, TX (US); Perry P. He, Austin, TX (US); Ahsan Ul Aziz, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1036 days.

(21) Appl. No.: 10/730,449

(22) Filed: Dec. 8, 2003

(65) Prior Publication Data

US 2005/0123033 A1 Jun. 9, 2005

(51) Int. Cl.
*H03H 7/40* (2006.01)
*H04B 3/20* (2006.01)
*H04M 9/08* (2006.01)

(52) U.S. Cl. .................... 375/232; 370/290; 379/406.08

(58) Field of Classification Search ......... 375/229–232, 375/222; 370/286, 289, 290–292; 379/406.08, 379/406.09, 390.03
See application file for complete search history.

(56) References Cited

U.S. PATENT DOCUMENTS

| 4,546,216 | A | | 10/1985 | Tegethoff |
| 5,327,495 | A | | 7/1994 | Shenoi et al. |
| 5,463,618 | A | * | 10/1995 | Furukawa et al. ........... 370/290 |
| 5,563,944 | A | | 10/1996 | Hasegawa |
| 5,668,794 | A | | 9/1997 | McCaslin |
| 5,687,229 | A | * | 11/1997 | Sih ........................ 379/406.09 |
| 5,737,408 | A | | 4/1998 | Hasegawa |
| 5,937,060 | A | | 8/1999 | Oh |
| 6,108,412 | A | * | 8/2000 | Liu et al. ............... 379/406.09 |
| 6,282,286 | B1 | | 8/2001 | Reesor |
| 6,532,289 | B1 | | 3/2003 | Magid |
| 6,594,359 | B1 | * | 7/2003 | Park ........................... 379/391 |
| 6,622,030 | B1 | | 9/2003 | Romesburg |
| 6,925,177 | B2 | * | 8/2005 | Nishimura ............. 379/406.07 |
| 6,959,167 | B1 | * | 10/2005 | Dehandschutter .............. 455/1 |
| 2003/0123674 | A1 | | 7/2003 | Boland |
| 2003/0206624 | A1 | | 11/2003 | Domer |
| 2003/0235244 | A1 | * | 12/2003 | Pessoa et al. ................ 375/232 |

FOREIGN PATENT DOCUMENTS

| WO | WO 01/10102 A2 | 2/2001 |
| WO | WO 01/10102 A3 | 2/2001 |
| WO | WO 02/03563 A1 | 1/2002 |

OTHER PUBLICATIONS

Heitkamper et al., "Adaptive Gain Control for Speech Quality Improvement and Echo Suppression," IEEE 1993, pp. 455-458.

* cited by examiner

*Primary Examiner*—Khanh C Tran
(74) *Attorney, Agent, or Firm*—Susan C. Hill; Joanna G. Chiu

(57) ABSTRACT

A method and apparatus for dynamically inserting gain in an adaptive filter is taught. This selective insertion of gain may be used to allow an adaptive filter to converge more quickly and/or to overcome inherent limitations of the adaptive filter. An echo canceller (e.g. 20 and 22 in FIG. 1) is just one possible use for an adaptive filter having a shorter convergence time. However, virtually all uses of an adaptive filter can benefit from a shorter convergence time and/or improved filtering performance.

63 Claims, 18 Drawing Sheets

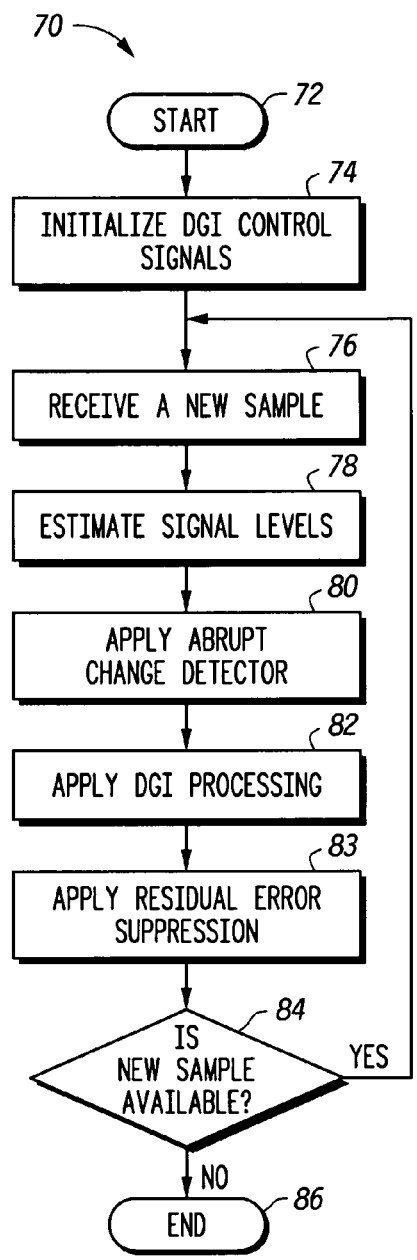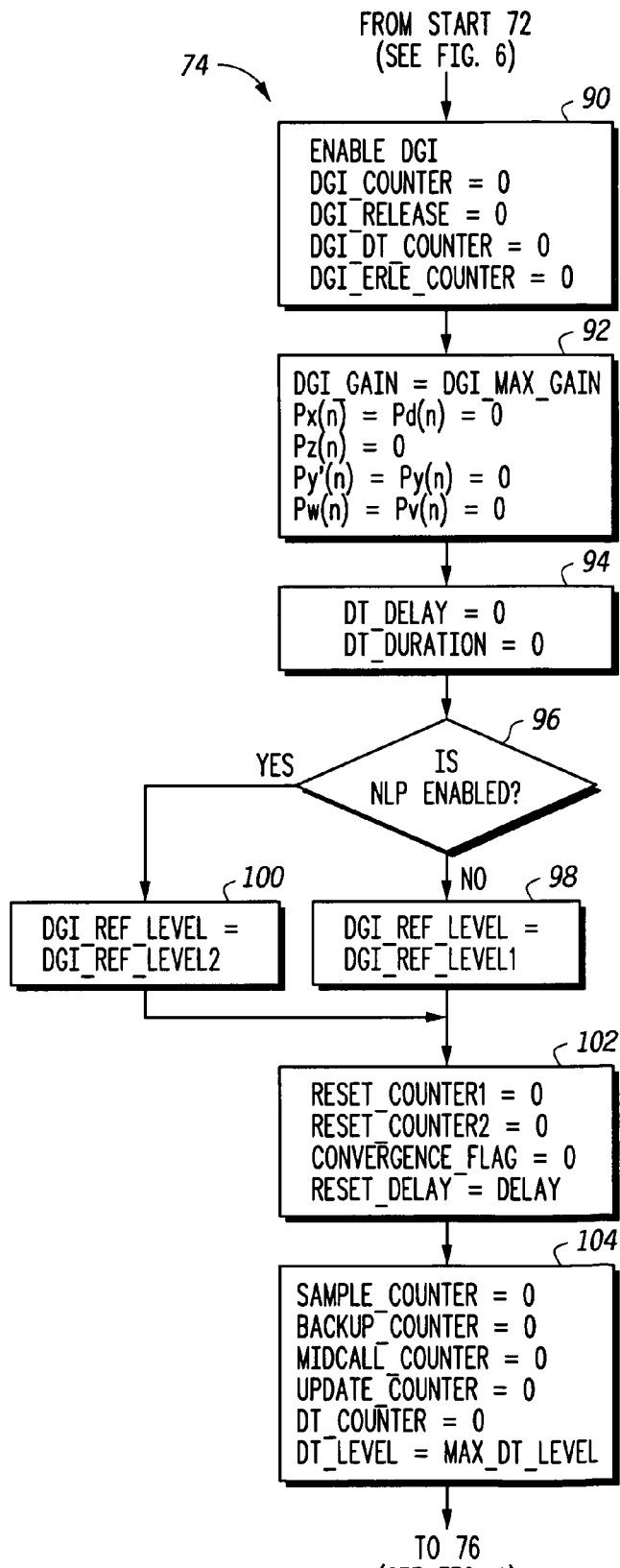
FIG. 6
FIG. 7

METHOD AND APPARATUS FOR DYNAMICALLY INSERTING GAIN IN AN ADAPTIVE FILTER SYSTEM

FIELD OF THE INVENTION

The present invention relates generally to an adaptive filter system, and more specifically, to a method and apparatus for dynamically inserting gain in an adaptive filter system.

RELATED ART

Echo cancellation is used in a telecommunication network (such as in a Public Switching Telephone Network (PSTN) or Packet Telephony (PT) network) to ensure voice quality through elimination or reduction of electric or line echo from the telecommunication network. The source of this electric or line echo may be the impedance mismatch of a hybrid circuit which is a device used to convert signals from a four-wire communication network interface to a two-wire local subscriber loop and vice versa. Echoes with long delays in the communication network may be noticeable which may create significant or even unbearable disturbance during telephone voice communication. Echoes may particularly be a problem at the beginning of a telephone call or when the parameters of the system change (e.g. an additional person joins the telephone call; the physical environment changes, for example switching from a phone handset to a speaker phone). Therefore, a need exists for an echo canceller that is able to eliminate the echoes completely or to reduce them to an acceptable level within the telecommunication network.

An echo canceller is one example of an application which uses an adaptive filter, where the echo is considered to be undesirable noise. Many other applications also use an adaptive filter in which noise in general is a problem. Therefore, a need exists for an adaptive filter system that is able to eliminate noise completely or to reduce noise to an acceptable level.

BRIEF DESCRIPTION OF THE DRAWINGS

The present invention is illustrated by way of example and not limited by the accompanying figures, in which like references indicate similar elements, and in which:

FIGS. 6-22 illustrate, in flow diagram form, a portion of the operation of the echo canceller of FIG. 2 which uses dynamic gain insertion (DGI) in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" and "negate" (or "deassert") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. The symbols "*" and "·" both indicate a multiplication operation. Also note that the lack of a symbol between values indicates a multiplication operation. A FIFO or other type of data storage may be used to provide the delays used throughout this invention document. Note that any ranges or example values given herein are approximations and are intended only for illustrative purposes. Alternate embodiments of the present invention may use different ranges or values.

Also, note that in the descriptions herein, variable names are generally used consistently with each group of related figures. Some variable names, though, may be reused to refer to different things in different groups of related figures. For example, in reference to a particular group of figures, M may refer to a measurement cycle, and in reference to a different group of figures, M may be used as a counter value. The description of each variable name in the equations and figures below, though, will be provided as they are used.

Figure 1:
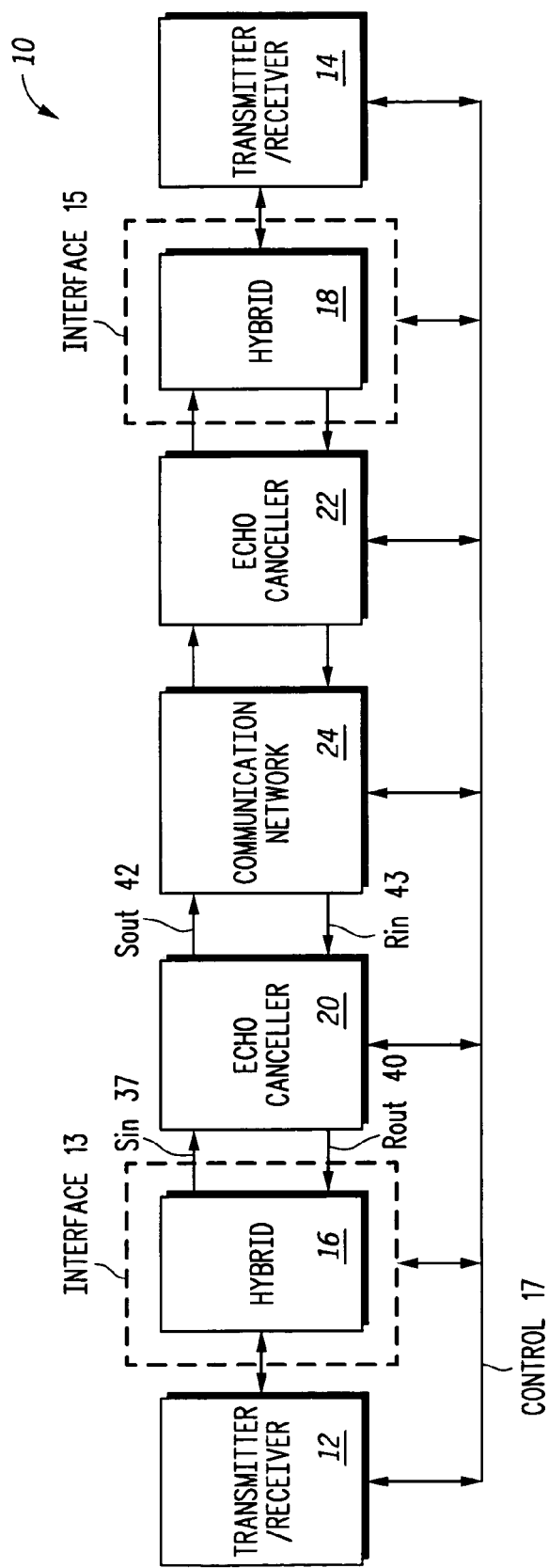
FIG. 1 illustrates a communication system in accordance with one embodiment of the present invention.

FIG. 1 illustrates one embodiment of a communication system 10. Communication system 10 includes transmitter/receiver 12, interface 13, hybrid circuit 16 (also referred to as hybrid 16), echo canceller 20, communication network 24, echo canceller 22, interface 15, hybrid 18, and transmitter/receiver 14. Interface 13 includes hybrid 16 and interface 15 includes hybrid 18. Transmitter/receiver 12 is bidirectionally coupled to hybrid 16 (where, in one embodiment, transmitter/receiver 12 is coupled to hybrid 16 via a two-wire connection such as a twisted pair). Hybrid 16 is coupled to echo canceller 20, providing a send signal Sin 37 to echo canceller 20 via unidirectional conductors and receiving a receive signal Rout 40 from echo canceller 20 via unidirectional conductors (where, in one embodiment, each of Sin 37 and Rout 40 are provided and received via a wire pair). Echo canceller 20 is coupled to communication network 24 and provides an echo cancelled send signal Sout 42 to communication network 24 and receives Rin 43 from communication network 24.

Similarly, transmitter/receiver 14 is bidirectionally coupled to hybrid 18 (where, in one embodiment, transmitter/receiver 14 is coupled to hybrid 18 via a two-wire connection such as a twisted pair). Hybrid 18 is coupled to echo canceller 22 via unidirectional conductors for providing signals to echo canceller 22 and unidirectional conductors for receiving signals from echo canceller 22 (where, in one embodiment, each set of unidirectional conductors may be a twisted wire pair). Echo canceller 22 is coupled to communication network 24 and provides an echo cancelled send signal to communication network 24 and receives a received signal from communication network 24. Control 17 may be a control bus that includes one or more control signals that may be provided to each of transmitter/receiver 12, hybrid 16, echo canceller 20, communication network 24, echo canceller 22, hybrid 18, and transmitter/receiver 14, as needed. Therefore, in one embodiment, control 17 is coupled to every unit within communication system 10, while in alternate embodiments only a portion of the units may require communication with control 17.

Transmitter/receiver 12 provides and receives data signals to and from hybrid 16. Hybrid 16 provides for a four-wire to two-wire conversion between transmitter/receiver 12 and communication network 24. Therefore, transmitter/receiver 12 can be any device used for communicating over communication network 24, such as, for example, a telephone or a modem, which is coupled to hybrid 16 via a two-wire subscriber line. Therefore, hybrid 16 provides an interface between a local subscriber loop (having transmitter/receiver 12) and a communication network (communication network 24). Transmitter/receiver 14 and hybrid 18 function analogously to transmitter/receiver 12 and hybrid 16, respectively.

In communications between transmitter/receiver 12 and transmitter/receiver 14, electrical or line echo is introduced into the communication by hybrid 16 and hybrid 18. The source of this echo is the impedance mismatch within hybrid 16, as well as the impedance mismatch within hybrid 18. For example, if the impedance within hybrid 16 were perfectly matched, all of the energy from received signal Rout 40 would be transmitted to transceiver/receiver 12. However, if there is any impedance mismatch within hybrid 16, some of the energy from received signal Rout 40 would be reflected back through send signal Sin 37. If the round trip delay through communication network 24 (from transmitter/receiver 14, in the case of echo introduced by hybrid 16) is sufficiently long, the reflected echo received by transmitter/receiver 14 from Sin 37 will be noticeable during the communication. This may result in noticeable echoes or even unbearable disturbance during a telephone voice communication. In one example, a sufficiently long delay may refer to a round trip delay of greater than 40 milliseconds. As the round trip delay increases, the echoes may become worse and thus more noticeable and disruptive. (If, on the other hand, the round trip delay is significantly smaller, the echo may not be disruptive since it may be indistinguishable from the side tone.) The round trip delay may include a variety or combination of different delays, including transmission delay, processing delay, computation delay, etc. Depending on the communication system, the round trip delay may be sufficiently large to disrupt communication. Therefore, echo cancellers 20 and 22 may be used to reduce the line echo in communication system 10. For example, the echo introduced by hybrid 16 from a signal received via Rout 40 (from transmitter/receiver 14) and reflected back via Sin 37 is processed via echo canceller 20 to reduce the reflected echo prior to sending the signal Sout 42 through communication network 24 back to transmitter/receiver 14.

As discussed above, line echo is introduced by the impedance mismatch within hybrid 16 and the impedance mismatch within hybrid 18. Also, acoustic echo may be introduced into the communication via transmitter/receiver 12 and transmitter/receiver 14. For example, if transmitter/receiver 12 is a speaker phone, the received signal, after being output via the speaker, will bounce around the surrounding environment, and some of the signal may be redirected back into the microphone of transmitter/receiver 12 and also be reflected back to transmitter/receiver 14. In one embodiment, echo canceller 20 may also function to reduce some aspects of acoustic echo in addition to line echo.

In one embodiment, communication network 24 may include a packet telephony network (including, for example, voice over internet protocol (IP), data over packet, asynchronous transfer mode (ATM), etc., and could either apply to wireless or wireline systems) or Public Switching Telephone Network (PSTN). In alternate embodiments, communication system 10 may refer to any type of communication system. Any communication pathway may be used as interface 13 or interface 15.

Control 17 provides a control pathway among transmitter/receiver 12 and 14, hybrid 16 and 17, echo canceller 20 and 22, and communication network 24. Control signals transmitted via control 17 are generally not in-line signals. For example, control 17 may include an enabling/disabling signal to enable or disable echo canceller 20 or 22. Control 17 may also include a signal to indicate whether the telephone is on or off the hook.

In the embodiments described herein, transmitter/receiver 12 will be referred to as the near end with respect to echo canceller 20 and transmitter/receiver 14 will be referred to as the far end with respect to echo canceller 20. Therefore, the embodiments herein will be discussed with reference to echo canceller 20; however, it should be understood that echo canceller 22 operates analogously to echo canceller 20. That is, in an alternate embodiment, transmitter/receiver 14 may be referred to as the near end with respect to echo canceller 22 and transmitter/receiver 12 the far end with respect to echo canceller 22.

Figure 2:
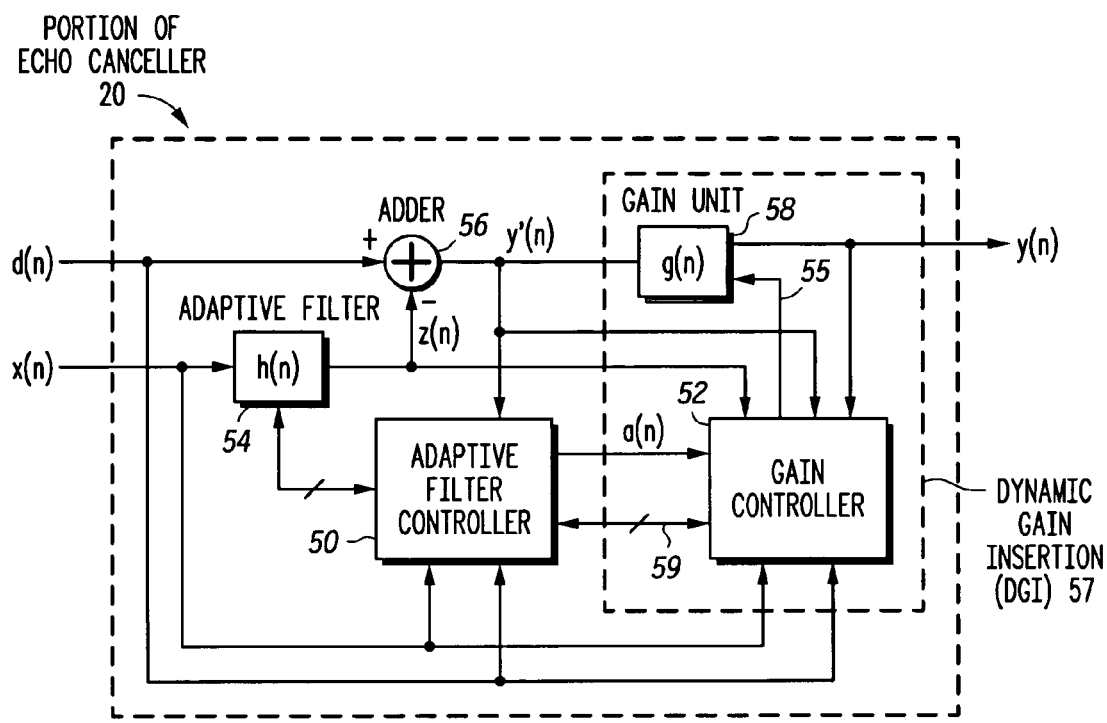
FIG. 2 illustrates a portion of the echo canceller of the communication system of FIG. 1 in accordance with one embodiment of the present invention.

FIG. 2 illustrates one embodiment of a portion of echo canceller 20 of FIG. 1 where, as mentioned above, transmitter/receiver 12 is the near end and transmitter/receiver 14 is the far end. For the embodiment illustrated in FIG. 2, $d(n)$ corresponds to Sin 37 of FIG. 1, $y(n)$ corresponds to Sout 42 of FIG. 1, and $x(n)$ corresponds to both Rin 43 and Rout 40 of FIG. 1. In one embodiment, these signals are generated at an 8 KHz sampling rate, but different rates can be used. Thus, $d(n)$ is the send signal transmitted from transmitter 12, via hybrid 16. Echo canceller 20 provides an echo cancelled send signal $y(n)$ to receiver 14 via communication network 24 and hybrid 18. And, $x(n)$ is a receive signal received from transmitter 14 via hybrid 18 and communication network 24, and then provided unchanged as an input to receiver 12 via hybrid 16. As discussed above, $d(n)$ may include reflected echo introduced by the impedance mismatch within hybrid 16. Therefore, echo canceller 20 reduces (or eliminates) the introduced reflected echo and provides the echo cancelled send signal $y(n)$. That is, if the impedance in hybrid 16 is perfectly matched, a signal received at the input of the hybrid 16, for example $x(n)$, would result in virtually no response from hybrid 16 at $d(n)$ because there would be no reflected echo (in the ideal and practically unattainable case).

The portion of echo canceller 20 illustrated in FIG. 2 includes an adaptive filter 54 having a transfer function $h(n)$ which receives $x(n)$ as an input, is bi-directionally coupled to adaptive filter controller 50, and which provides an output $z(n)$ to an adder 56 and to gain controller 52. Adder 56 also receives an input $d(n)$ and provides an output $y'(n)$ to a gain unit 58. Gain unit 58 has a transfer function $g(n)$, receives input 55 from gain controller 52, and provides an output $y(n)$. The output of adder 56, namely $y'(n)$, is also provided to adaptive filter controller 50 and to gain controller 52. The output y(n) from gain unit 58 is also provided as an input to gain controller 52. Gain controller 52 receives information a(n) from adaptive filter controller 50. Gain controller 52 and adaptive filter controller 50 are also bi-directionally coupled by way of signals 59. The input signal d(n) and x(n) are also both provided as inputs to adaptive filter controller 50 and to gain controller 52. In one embodiment, dynamic gain insertion (DGI) 57 includes gain unit 58 and gain controller 52. Alternate embodiments may implement DGI 57 in a different manner than that illustrated by FIG. 2. In alternate embodiments, the functionality illustrated in FIG. 2 may be implemented using hardware, software, or any combination of hardware and software.

Figure 3:
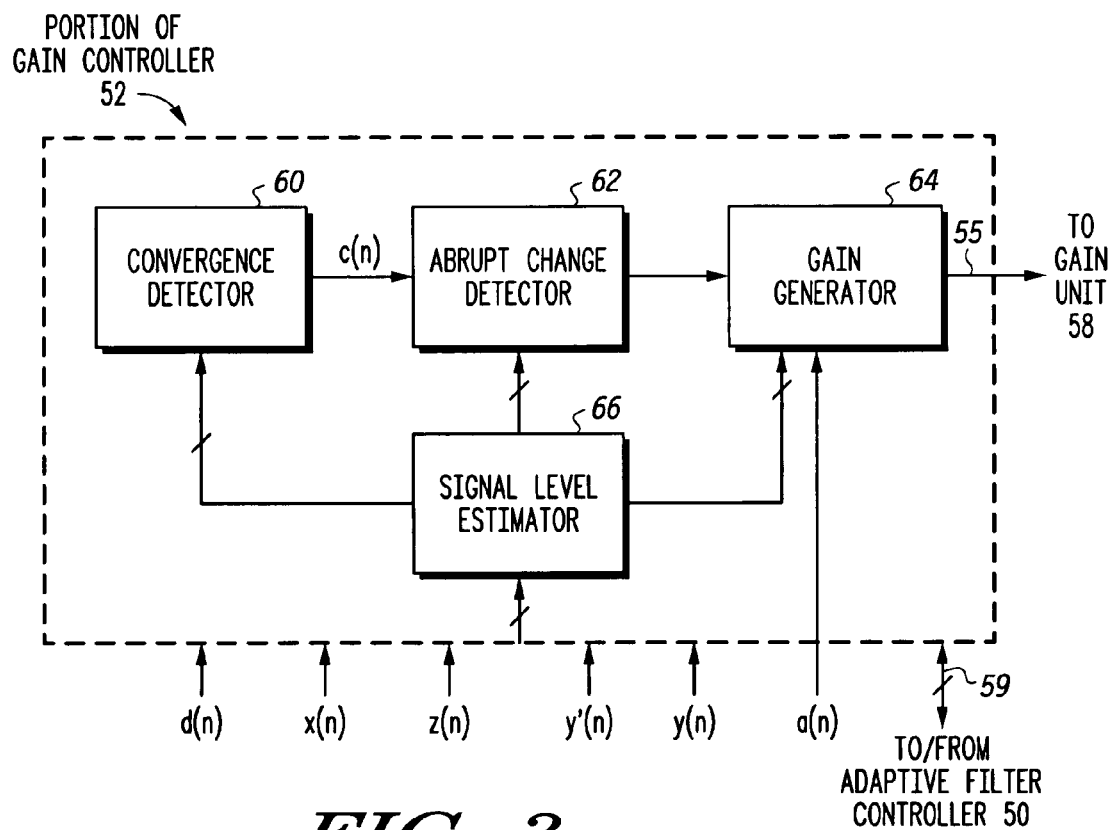
FIG. 3 illustrates a portion of the gain controller of FIG. 2 in accordance with one embodiment of the present invention.

FIG. 3 illustrates one embodiment of a portion of gain controller 52 of FIG. 2. In one embodiment, gain controller 52 includes a signal level estimator 66 which receives d(n), x(n), z(n), y'(n), and y(n) as inputs and provides outputs to convergence detector 60, abrupt change detector 62, and gain generator 64. Alternate embodiments may provide fewer, more, or different input signals to signal level estimator 66. In one embodiment, signals 59 are bi-directionally coupled to convergence detector 60 and to abrupt change detector 62. Alternate embodiments may provide signals 59 to fewer, more, or different portions of gain controller 52. In one embodiment, convergence detector 60 provides an input c(n) to abrupt change detector 62. Abrupt change detector 62 provides an input to gain generator 64. Gain generator 64 also receives an input a(n) from adaptive filter controller 50. Gain generator 64 provides an output 55 to gain unit 58. The portion of gain controller 52 illustrated in FIG. 3 is just one possible implementation. Alternate embodiments may use any desired configuration for gain controller 52.

For one embodiment of the signal level estimator 66 of FIG. 3, the power level or short-term energy level of a plurality of signals is determined according to the following equation:

$$Ps(n)=b\,Ps(n-1)+(1-b)s^2(n), \text{ where } 0<b<1 \qquad \text{Equation 1:}$$

In the above equation, s(n) can be signals d(n), x(n), z(n), y'(n), and y(n); Ps(n) is the estimated signal power of s(n) at time n; b is a predetermine constant which is greater than zero and less than one. Alternative embodiments can also be defined by replacing $s^2(n)$ by $|s(n)|^m$, m=1, 2, ...

In one embodiment, convergence detector 60 asserts a convergence flag c(n)=1 during adaptive filter updates, i.e. c(n)=1, if the levels of d(n) and z(n) are very close and the level of y'(n) is much smaller than the level of d(n). Alternate embodiments may detect convergence of an adaptive filter (e.g. adaptive filter 54 of FIG. 2) in a different manner. Alternate embodiments may use a mechanism other than a flag, or a different value for the flag, to indicate that convergence has been detected.

In one embodiment, abrupt change detector 62 detects an abrupt change in the following manner. If the adaptive filter (e.g. adaptive filter 54 of FIG. 2) is temporarily producing a convergence defect, i.e. the level of y'(n) is larger than the level of d(n), an abrupt change is detected if either the levels of y'(n) and z(n) are close, or the levels of d(n) and z(n) are not close. Otherwise, i.e. the level of y'(n) is smaller than or equal to the level of d(n), an abrupt change is detected if c(n)=1 and both the levels of d(n) and z(n) are appreciably different and the levels of d(n) and y'(n) are appreciably different. Note that for some embodiments, the abrupt change events define the sample number ($n_1$) where the gain generator 64 is activated. Alternate embodiments may use different selection criteria and may monitor different signals in order to detect when an abrupt change has occurred.

Also, note that in one embodiment, the levels of two signals may be considered "close" when a minimum of the two levels is within a predetermined range of a maximum of the two levels, where the predetermined range may be, for example, 5 percent, 10 percent, 20 percent, or 25 percent, or any other value as needed for a particular design. For example, in one embodiment, the level of y'(n) may be considered close to the level of z(n) when the minimum of the level of y'(n) and the level of z(n) is within 10 percent of the maximum of the level of y'(n) and the level of z(n). Also, in one embodiment, the levels of two signals may be considered "appreciably different" or "not close" when a minimum of the two levels is outside a predetermined range of a maximum of the two levels, where the predetermined range may be, for example, 10 percent, 20 percent, 25 percent, 50 percent, or any other value as needed for a particular design. For example, in one embodiment, the level of d(n) may be considered appreciably different from the level of z(n) when the minimum of the level of d(n) and the level of z(n) is not within (or is outside) 25 percent of the maximum of the level of d(n) and the level of z(n). Note that in alternate embodiments, close or appreciably different or not close may be defined differently.

In one embodiment, gain generator 64 provides a gain transfer function g'(n) to gain unit 58 by way of one or more signals 55. For one embodiment of the gain generator 64, the gain transfer function g'(n) is determined according to the following equation:

$$g'(n) = a(n)\{\text{Max}(g'(n-1) - \Delta g_1, g_{\min}) \qquad \text{Equation 2:}$$
$$[u(n-n_1) - u(n-n_2)] +$$
$$g'(n-1)[u(n-n_2) - u(n-n_3)] +$$
$$\text{Min}(g'(n-1) + \Delta g_2, g_{\max})u(n-n_3)\} +$$
$$(1-a(n))g'(n-1)$$

where $n_3>n_2>n_1$
u(n): Step function
$\Delta g_i$: Gain correction

Referring back to FIG. 2, in one embodiment, gain unit 58 uses this input g'(n) along with the input y'(n) to determine g(n) according to the following equation:

$$g(n)=\text{Min}(\text{Max}(g'(n)+\Delta g_3 \text{Sign}[P_{ref}(n)-P_y(n)], g_{\min}),$$
$$g_{\max})[u(n-n_2)-u(n-n_3)]+\text{Min}(g'(n)+\Delta g_4, g_{\max})u$$
$$(n-n_4) \qquad \text{Equation 3:}$$

where $n_4>n_3>n_2$
u(n): Step function
$\Delta g_i$: Gain correction

In equation 2 and equation 3 above, $n_4>n_3>n_2>n_1$; u(n) is a predetermined step function; and $\Delta g_i$ is a predetermined set of gain correction values. Although the gain function of equations 2 and 3 illustrate an additive gain correction, alternate embodiments may use a multiplicative gain. In yet other alternate embodiments, the gain function may be implemented via a look-up table or any other means which may allow for correcting gain either linearly or non-linearly.

Note that FIGS. 1-3 illustrate one embodiment of blocks found within communication system 10 and echo canceller 20. Alternate embodiments may include various different elements than those illustrated, more elements than those illustrated or fewer elements than those illustrated, depending on the functionality desired. Furthermore, the blocks within FIGS. 1-3 can be grouped differently or coupled differently and still achieve similar results. Therefore, FIGS. 1-3 are only meant to provide examples to illustrate the concepts that will be discussed below. Also, although the connections in FIGS. 1-3 may have been drawn as a single conductor (unidirectional or bidirectional) or as multiple conductors (unidirectional or bidirectional), a variety of different connections may be used. For example, a multiple conductor can be replaced with a variety of different single unidirectional or bidirectional conductors. Similarly, single conductors can be expanded into multiple unidirectional or bidirectional conductors. Signals can be communicated serially via a single conductor or can be communicated in parallel via multiple conductors. Also, signals can be time multiplexed via single or multiple conductors. Therefore, the connections illustrated in FIGS. 1-3 can be implemented in a variety of different ways while still achieving the desired functionality. Also, as will be described further below, the designs of FIGS. 1-3 can be implemented in hardware, software, or a combination of hardware and software.

Figure 4:
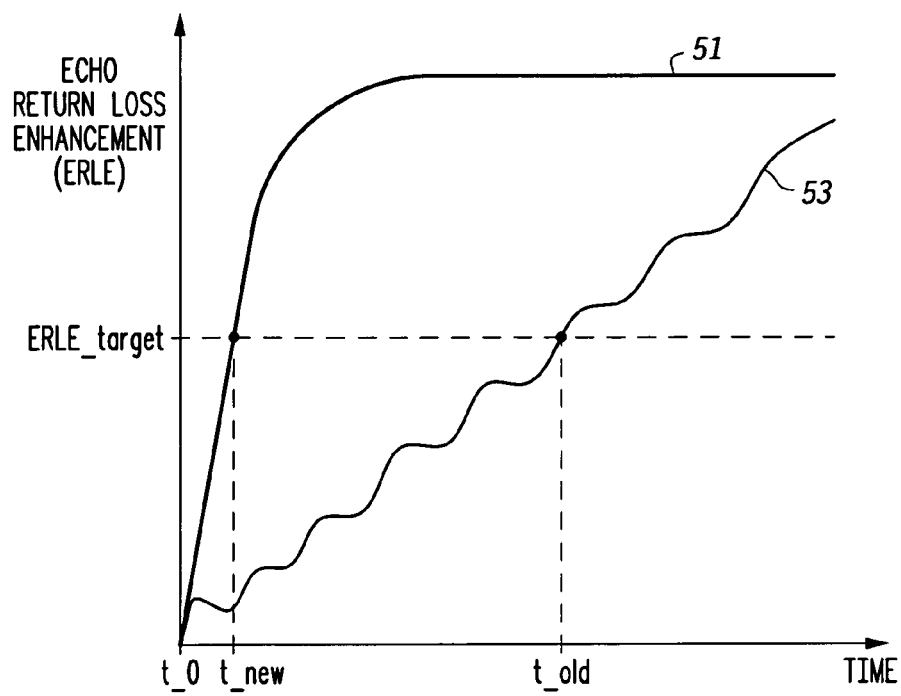
FIG. 4 illustrates a performance characteristic, namely echo return loss enhancement (ERLE), of the echo canceller of FIG. 1 as compared to prior art.

FIG. 4 illustrates ERLE, a performance characteristic, as a function of time for the echo canceller of FIG. 1 (curve 51) as compared to prior art (curve 53). In one embodiment, ERLE_target is a target or minimum ERLE which may be used to indicate that an adaptive filter has sufficiently converged, such as, for example, an adaptive filter in an echo canceller. Signal 53 illustrates ERLE as a function of time for a prior art echo canceller (not shown). Thus, time t_old is the amount of time from t_0 that it takes for ERLE_target to be reached, and thus for the adaptive filter in the prior art echo canceller to sufficiently converge. In contrast, signal 51 illustrates ERLE as a function of time for one embodiment of the echo canceller 20 of FIG. 1. Time t_new is the length of time from t_0 that it takes for ERLE_target to be reached, and thus for the adaptive filter 54 in echo canceller 20 (see FIG. 2) to sufficiently converge. Note that the adaptive filter convergence time represented by t_new is significantly shorter that the adaptive filter convergence time represented by t_old. Providing a method and/or apparatus for an adaptive filter to converge more quickly is an important capability. An echo canceller (e.g. 20 and 22 in FIG. 1) is just one possible use for an adaptive filter having a shorter convergence time. Virtually all uses of an adaptive filter can benefit from a shorter convergence time.

Although the embodiments illustrated herein use an adaptive filter in the context of an echo canceller to describe the advantages of a shorter adaptive filter convergence time, virtually all uses of an adaptive filter can benefit from a shorter convergence time and are within the scope of the present invention. Also note adaptive filter 54 may be any type of filter, such as, for example, an IIR filter, FIR filter, a polynomial filter, etc., as needed for a particular design.

Figure 5:
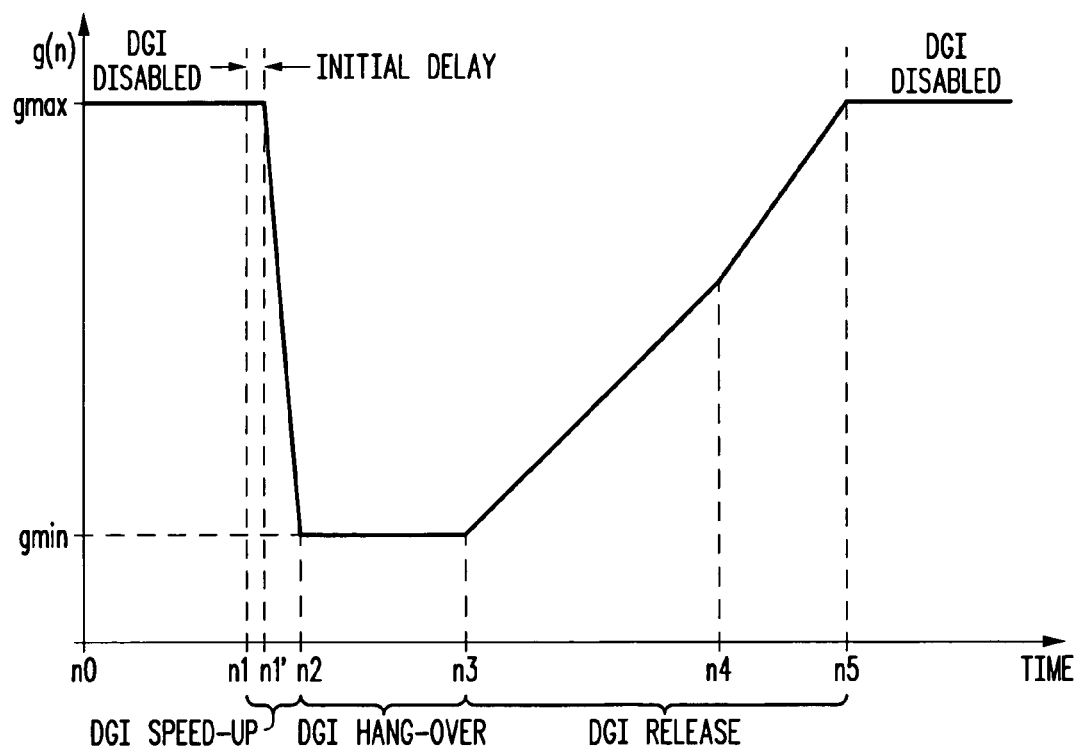
FIG. 5 illustrates a gain function of the echo canceller of FIG. 2 in accordance with one embodiment of the present invention.

FIG. 5 illustrates one embodiment of a transfer function g(n) of gain unit 58 of FIG. 2. Time n0 represents a time during a telephone call when dynamic gain insertion (DGI) is disabled and the gain transfer function g(n) is approximately equal to a maximum value (gmax). Note that for one embodiment of the present invention, the DGI output is equal to y(n), which is also equal to g(n)*y'(n). Alternate embodiments may define DGI in a different manner. Depending upon the embodiment, n0 may or may not be the beginning of the phone call. For the embodiment illustrated in FIG. 5, DGI is disabled from time n0 to time n1. At time n1, an abrupt change is detected (e.g. by abrupt change detector 62 of FIG. 3). In one embodiment, when an abrupt change is detected, a predetermined gain transfer function (such as the g(n) illustrated in FIG. 5) is applied for a predetermined period of time (such as, for example, n1-n5 or n1'-n5 of FIG. 5). Various embodiments may monitor one or more parameters of system 10 in order to determine when an abrupt change has been detected. For an echo canceller 20, power levels of one or more signals may be monitored to determine if an abrupt change has been detected. For other embodiments of echo canceller 20, coefficients of an adaptive filter may be monitored to determine if an abrupt change has been detected. For embodiments using an adaptive filter outside the field of echo cancellers, any one or more appropriate parameters may be monitored to determine if an abrupt change has been detected.

Still referring to FIG. 5, the initial delay period from n1 to n1' is optional and may be added to allow a system 10 to verify that an abrupt change has indeed occurred. The purpose of this initial delay period may be to prevent an abrupt change from being erroneously recognized and acted upon when there has really been no such abrupt change in the system 10. The abrupt change must continue to be detected over the initial delay period in order for the system 10 to recognize and react to the abrupt change. Thus an abrupt change that is erroneously detected at time n1 due to a glitch in system 10 may not continue to be detected during the entire initial delay period. If this erroneous abrupt change (due to a system glitch) is no longer detected at time n1', DGI will remain disabled and the gain transfer function g(n) will not be adjusted due to detection of an abrupt change. Alternate embodiments may not include this initial delay period. Instead, any abrupt change detection will result in dynamic gain insertion being enabled.

In the embodiment illustrated in FIG. 5, once detection of an abrupt change has been confirmed at n1', DGI is enabled and the gain transfer function g(n) is very quickly reduced to a predetermined minimum level gmin. Alternate embodiments may use different values for gmin. Also, gmin may not be fixed but may be varied during operation in some applications based on the requirements of the system. The time n2 represents the point in time at which the gain transfer function g(n) reaches the selected minimum value gmin. In one embodiment, gmin is at least 25 percent of gmax, and the speed-up period (i.e. n2-n1) is at least 1 percent and at most 4 percent of the predefined period of time for DGI processing (i.e. n5-n1). The gain transfer function g(n) is then kept at approximately gmin for a DGI hang-over period from time n2 to time n3. In some embodiments, the DGI hang-over period or time is predefined, while for other embodiments it is variable. For some embodiments (e.g. echo canceller 20 of FIG. 1), the DGI hang-over period is a function of the convergence time of the adaptive filter (e.g. adaptive filter 54 of FIG. 2). For some embodiment, the DGI hang-over period is always selected to be a longer period of time than the convergence time of the adaptive filter. One purpose for this particular limitation is to ensure that the adaptive filter has converged using the new, greatly reduced gain (gmin) before the gain is allowed to significantly increase again. Also note that in one embodiment, automatic level control is used during the hang-over period to ensure that the level of the output signal is maintained at or near a target level (i.e. a target output or reference level).

Note that in the echo canceller embodiment illustrated in FIG. 1, an abrupt change may be detected when various parameters of system 10 change, such as, for example, an additional person is added to the telephone call, the transmission delay in communication network 24 changes abruptly, etc. One purpose for quickly reducing the gain transfer function g(n) when an abrupt change is detected is to increase the convergence speed or decrease the convergence time of the adaptive filter 54 (see FIG. 2). By increasing the responsiveness of the adaptive filter in this way, the adaptive filter is able to more quickly converge so that the newly introduced changes in echo may be more quickly cancelled from system 10. Alternate embodiments may use the same approach to improve the convergence speed of any adaptive filter, regardless of the application is which the adaptive filter is used. An echo canceller is just one possible use for an adaptive filter having an improved convergence time.

Referring to FIG. 5, the DGI release time is defined to be the time from n3 to n5. In one embodiment, the release time is at least 20 to at least 50 percent of the predefined period of time for DGI processing during which the gain is gradually increased. Alternate embodiments may release the dynamic gain insertion (DGI) is a wide variety of ways. The approach illustrated in FIG. 5 is just one possibility. The DGI release illustrated in FIG. 5 linearly increases the gain transfer function g(n) from time n3 to time n4 using a first predetermine slope. From time n4 to time n5, the DGI release uses a second predetermine slope to linearly increases the gain transfer function g(n). Alternate embodiments may use any one or more functions to increase the gain transfer function during the DGI release period. For some embodiments, n4 may be independent of n3; for other embodiments, n4 may be related to n3. In one embodiment, the first period, n3-n4, corresponds to adaptation of the adaptive filter while the second period, n4-n5, is independent of adaptation of the adaptive filter. The number of breakpoints n4 can vary from zero to as many as are desired. The functions used to increase g(n) need not be linear, but may be any desired function. The duration of the DGI release time may be selected based on the desired characteristics and response times of the system using the adaptive filter. The 2-stage profile illustrated in FIG. 5 for the DGI release period is just one of many possible profiles. At time n5, the gain transfer function g(n) returns to its DGI disabled state where the gain transfer function is once again approximately equal to the maximum value (gmax). In one embodiment, the gain transfer function g(n) disables itself at the end of the release period.

FIG. 6 includes a flow 70 that illustrates operation of one embodiment of echo canceller 20 of FIG. 1. Flow 70 is a broad overview of the functionality provided by an echo canceller such as echo canceller 20 of FIG. 2. Details of each step within flow 70 will be provided in more detail herein below. Flow 70 begins at start oval 72 and the flow proceeds to block 74 where the dynamic gain insertion (DGI) control signals are initialized. The flow then proceeds to block 76 where a new sample (x(n), d(n)) is received (see FIG. 2). The flow then proceeds to block 78 where one or more signal levels are estimated. The flow then proceeds to block 80 where the abrupt change detector is applied. The flow then proceeds to block 82 where DGI processing is applied. The flow then proceeds to block 83 where residual error suppression is applied. The flow then proceeds to decision diamond 84 where the question is asked "is a new sample available?". If the answer at decision diamond 84 is no, then the flow proceeds to end oval 86 where the flow ends for one the illustrated embodiment. If the answer at decision diamond 84 is yes, then the flow returns to end block 76 where a new sample is received. Alternate embodiments may use the DGI in a different manner than that illustrated in FIG. 6.

FIG. 7 includes a flow that illustrates one embodiment of block 74 of FIG. 6. From start oval 72, the flow 74 proceeds to block 90 where DGI is enabled and a plurality of variables are set or reset to an initial state. In one embodiment, variable DGI_COUNTER, DGI_RELEASE, DGI_DT_COUNTER, AND DGI_ERLE_COUNTER are all initialized to zero.

From block 90, the flow proceeds to block 92 where the DGI_GAIN is set equal to DGI_MAX_GAIN. Note that in one embodiment, DGI_MAX_GAIN is gmax of FIG. 5 (e.g. $1-2^{-5}$). Also, in block 92, the estimated signal levels are initialized. For one embodiment, the signal levels that are estimated are power levels. Alternate embodiments may estimate any appropriate characteristic of FIG. 1, such as, for example, the coefficients of adaptive filter 54 (see FIG. 2), or the energy levels of various signals, etc. In the embodiment illustrated in FIG. 2, the power levels of x(n), d(n), z(n), y(n), y'(n), v(n) and w(n) are initialized to zero. In one embodiment, v(n) and w(n) are different instances of a background noise signal, which is a subset of y'(n) when certain conditions are met. Decision diamond 120 of FIG. 8 describes one set of conditions under which y'(n) equals w(n). Similarly, decision diamond 494 of FIG. 22 describes another condition under which y'(n) equals v(n). Alternate embodiments may define v(n) and w(n) in a different manner. From block 92, the flow proceeds to block 94 where DT_DELAY and DT_DURATION are initialized to zero.

From block 94, the flow then proceeds to decision diamond 96 where the question is asked "is NLP enabled?". If NLP (nonlinear processing) is not enabled, the flow proceeds to block 98 where DGI_REF_LEVEL is set equal to DGI_REF_LEVEL1 (e.g. −36 dBm0); and if NLP is enabled, the flow proceeds to block 100 where DGI_REF_LEVEL is set equal to DGI_REF_LEVEL2 (e.g. −72 dBm0). Alternate embodiments may use any number of reference levels. From blocks 98 and 100, the flow proceeds to block 102 where RESET_COUNTER 1, RESET_COUNTER2, and CONVERGENCE_FLAG are all initialized to zero, and RESET_DELAY is set equal to DELAY (e.g. 900*8, which corresponds to 900 ms at an 8 KHz sampling rate). In one embodiment, CONVERGENCE_FLAG is illustrated in FIG. 3 as c(n). The flow then proceeds to block 104 where several other values are initialized, namely SAMPLE_COUNTER, BACKUP_COUNTER, MIDCALL_COUNTER, UPDATE_COUNTER, and DT_COUNTER, which for the illustrated embodiment are all initialized to zero. Also, DT_LEVEL is set equal to MAX_DT_LEVEL (e.g. 0 dBm0). The flow then proceeds to block 76 (see FIG. 6).

Figure 8:
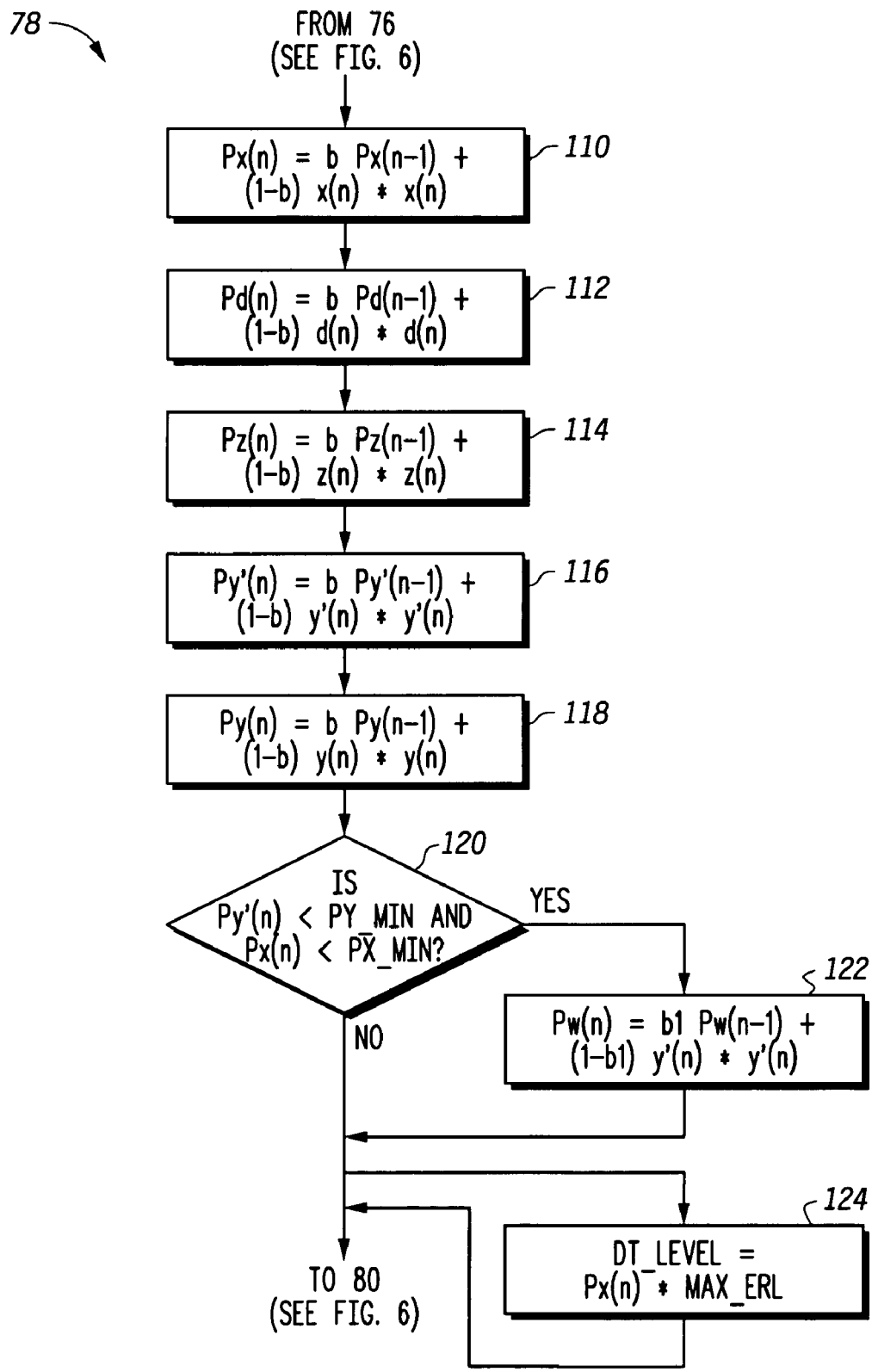

FIG. 8 includes a flow that illustrates one embodiment of block 78 of FIG. 6. From block 76, the flow 78 proceeds to block 110 where the estimated power level of x(n), namely Px(n), is set equal to Px(n)=b Px(n)+(1−b) x(n)*x(n) (e.g. $b=1-2^{-5}$). From block 110, the flow 78 proceeds to block 112 where the estimated power level of d(n), namely Pd(n), is set equal to Pd(n)=b Pd(n−1)+(1−b) d(n)*d(n). From block 112, the flow 78 proceeds to block 114 where the estimated power level of z(n), namely Pz(n), is set equal to Pz(n)=b Pz(n−1)+(1−b) z(n)*z(n). From block 114, the flow 78 proceeds to block 116 where the estimated power level of y'(n), namely Py'(n), is set equal to Py'(n)=b Py'(n−1)+(1−b) y'(n)*y'(n). From block 116, the flow 78 proceeds to block 118 where the estimated power level of y(n), namely Py(n), is set equal to Py(n)=b Py(n)+(1−b) y(n)*y(n). From block 118, the flow 78 proceeds to decision diamond 120 where the question is asked "is Py'(n)<PY_MIN and Px(n)<PX_MIN?" (e.g. PY_MIN=−33 dBm0 and PX_MIN=−27 dBm0). If the answer at decision diamond 120 is yes, the flow 78 proceeds to block 122 where the estimated power level of w(n), namely Pw(n), is set equal to Pw(n)=b1*Pw(n)+(1−b1) y'(n)*y'(n). If the answer at decision diamond 120 is no, the flow 78 proceeds to block 124. From block 122, the flow also proceeds to block 124. At block 124, the DT_LEVEL is set equal to Px(n)*MAX_ERLE (e.g. ¼). From block 124, the flow proceeds to block 80 (see FIG. 6).

Figure 9:
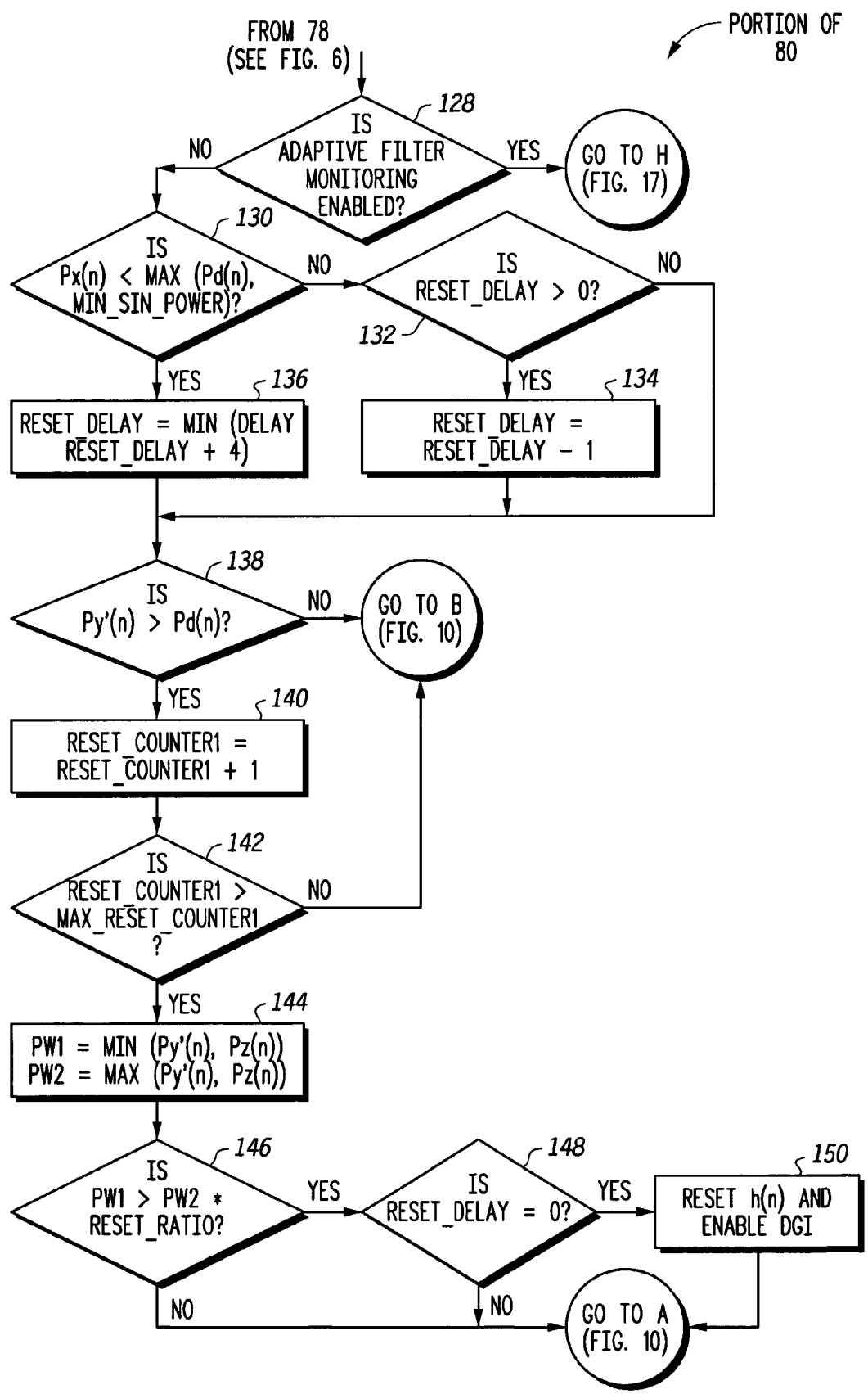

FIG. 9 includes a flow that illustrates one embodiment of a portion of block 80 of FIG. 6. From block 78 (see FIG. 6), the flow 80 proceeds to decision diamond 128 where the question is asked "is adaptive filter monitoring enabled?". Note that if adaptive filter monitoring is enabled, filter coefficients are part of the computation. However, if adaptive filter monitoring is not enabled, then decisions are based only on signal levels or power levels of various signals. Alternate embodiments of the present invention may include any useful parameter(s) (e.g. power, amplitude, energy) of one or more selected signals and/or other characteristics of system 10 (see FIG. 1), such as, for example, coefficients of adaptive filter 54 (see FIG. 2).

Figure 17:
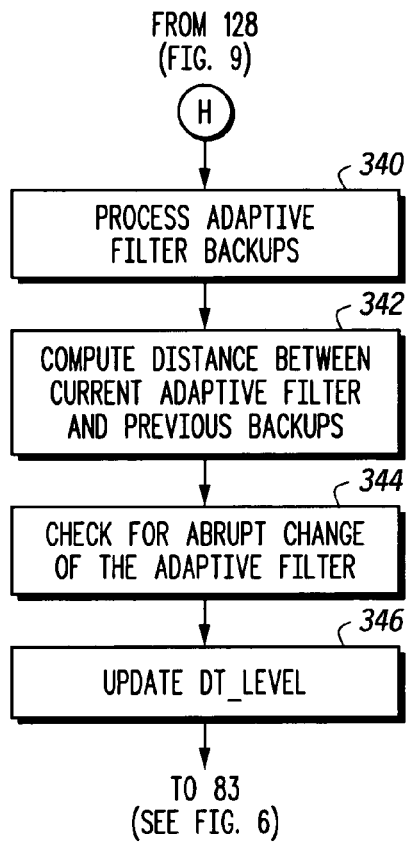

Returning to the flow of FIG. 9, if the answer at decision diamond 128 is yes, the flow proceeds to circle H in FIG. 17. If the answer at decision diamond 128 is no, the flow proceeds to decision diamond 130 where the question is asked "is Px(n)<(maximum value of Pd(n) and MIN_SIN_POWER)?" (e.g. MIN_SIN_POWER=−59 dBm0). If the answer at decision diamond 130 is yes, the flow proceeds to block 136 where RESET_DELAY is set equal to the minimum of DELAY and (RESET_DELAY+4). If the answer at decision diamond 130 is no, the flow proceeds to decision diamond 132 where the question is asked "is RESET_DELAY>0?". If the answer at decision diamond 132 is yes, the flow proceeds to block 134 where RESET_DELAY is set equal to RESET_DELAY−1. If the answer at decision diamond 132 is no, the flow proceeds to decision diamond 138. The flow also proceeds to decision diamond 138 from blocks 134 and 136. At decision diamond 138, the question is asked "is Py'(n)>Pd(n)?" If the answer at decision diamond 138 is no, the flow proceeds to circle B in FIG. 10. If the answer at decision diamond 138 is yes, the flow proceeds to block 140 where RESET_COUNTER1 is incremented by setting RESET_COUNTER1 equal to RESET_COUNTER1+1. From block 140, the flow continues to decision diamond 142 where the question is asked "is RESET_COUNTER1>MAX_RESET_COUNTER1?" (e.g. MAX_RESET_COUNTER1=10*8). If the answer to decision diamond 142 is no, the flow proceeds to circle B in FIG. 10. If the answer to decision diamond 142 is yes, the flow proceeds to block 144 where PW1 is set equal to the minimum of Py'(n) and Pz(n), and PW2 is set equal to the maximum of Py'(n) and Pz(n). From block 144, the flow proceeds to decision diamond 146 where the question is asked "is PW1>PW2*RESET_RATIO?" (e.g. RESET_RATIO may be 0.9, which corresponds to 10 percent of PW2; alternatively, RESET_RATIO may be 0.75, which corresponds to 25 percent of PW2). If the answer to decision diamond 146 is no, the flow proceeds to circle A in FIG. 10. If the answer to decision diamond 146 is yes, the flow proceeds to decision diamond 148 where the question is asked "is RESET_DELAY equal to 0?". If the answer to decision diamond 148 is no, the flow proceeds to circle A in FIG. 10. If the answer to decision diamond 148 is yes, the flow proceeds to block 150 where h(n) is reset (i.e. its coefficients are set to some default values, typically all zeroes) and DGI is enabled. Therefore, RESET_DELAY may be used to ensure that PW1>PW2 *RESET_RATIO for a predetermined amount of time. From block 150, the flow proceeds to circle A in FIG. 10.

Figure 10:
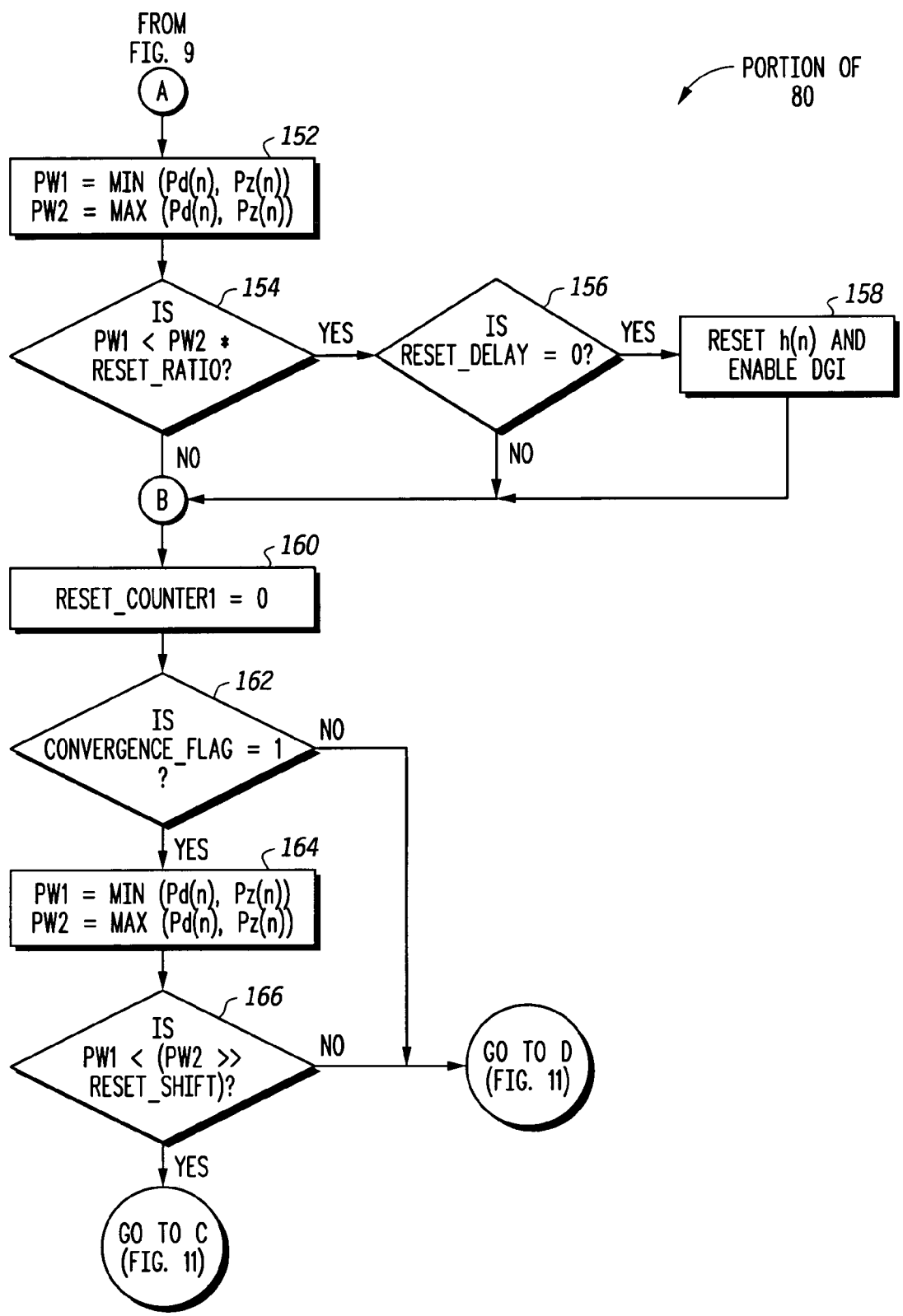

FIG. 10 includes a flow that illustrates one embodiment of a portion of block 80 of FIG. 6. From various points in FIG. 9, the flow 80 proceeds to circle A. From circle A, the flow proceeds to block 152 where PW1 is set equal to the minimum of Pd(n) and Pz(n), and PW2 is set equal to the maximum of Pd(n) and Pz(n). From block 152, the flow proceeds to decision diamond 154 where the question is asked "is PW1<PW2*RESET_RATIO?" (e.g. RESET_RATIO may be 0.9, which corresponds to 10 percent of PW2; alternatively, RESET_RATIO may be 0.75, which corresponds to 25 percent of PW2). If the answer to decision diamond 154 is no, the flow proceeds to circle B. If the answer to decision diamond 154 is yes, the flow proceeds to decision diamond 156 where the question is asked "is RESET_DELAY equal to 0?" If the answer to decision diamond 156 is no, the flow proceeds to circle B. If the answer to decision diamond 156 is yes, the flow proceeds to block 158 where h(n) is reset and DGI is enabled. Therefore, RESET_DELAY may be used to ensure that PW1>PW2 *RESET_RATIO for a predetermined amount of time. From block 158, the flow proceeds to circle B. From circle B, the flow proceeds to block 160 where RESET_COUNTER1 is set equal to 0. From block 160, the flow proceeds to decision diamond 162 where the question is asked "is CONVERGENCE_FLAG equal to 1?". If the answer to decision diamond 162 is no, the flow proceeds to circle D (see FIG. 11). If the answer to decision diamond 162 is yes, the flow proceeds to block 164 where PW1 is set equal to the minimum of Pd(n) and Pz(n), and PW2 is set equal to the maximum of Pd(n) and Pz(n). From block 164, the flow proceeds to decision diamond 166 where the question is asked "is PW1<(PW2 right shifted by the amount RESET_SHIFT)?" (e.g. RESET_SHIFT may be 1, which corresponds to 50 percent of PW2; alternatively, PW1 may be compared to see if it is less than PW2 times a ratio where the ratio may be, for example, 50 percent or 25 percent or 10 percent). If the answer to decision diamond 166 is no, the flow proceeds to circle D (see FIG. 11). If the answer to decision diamond 166 is yes, the flow proceeds to circle C (see FIG. 11).

Figure 11:
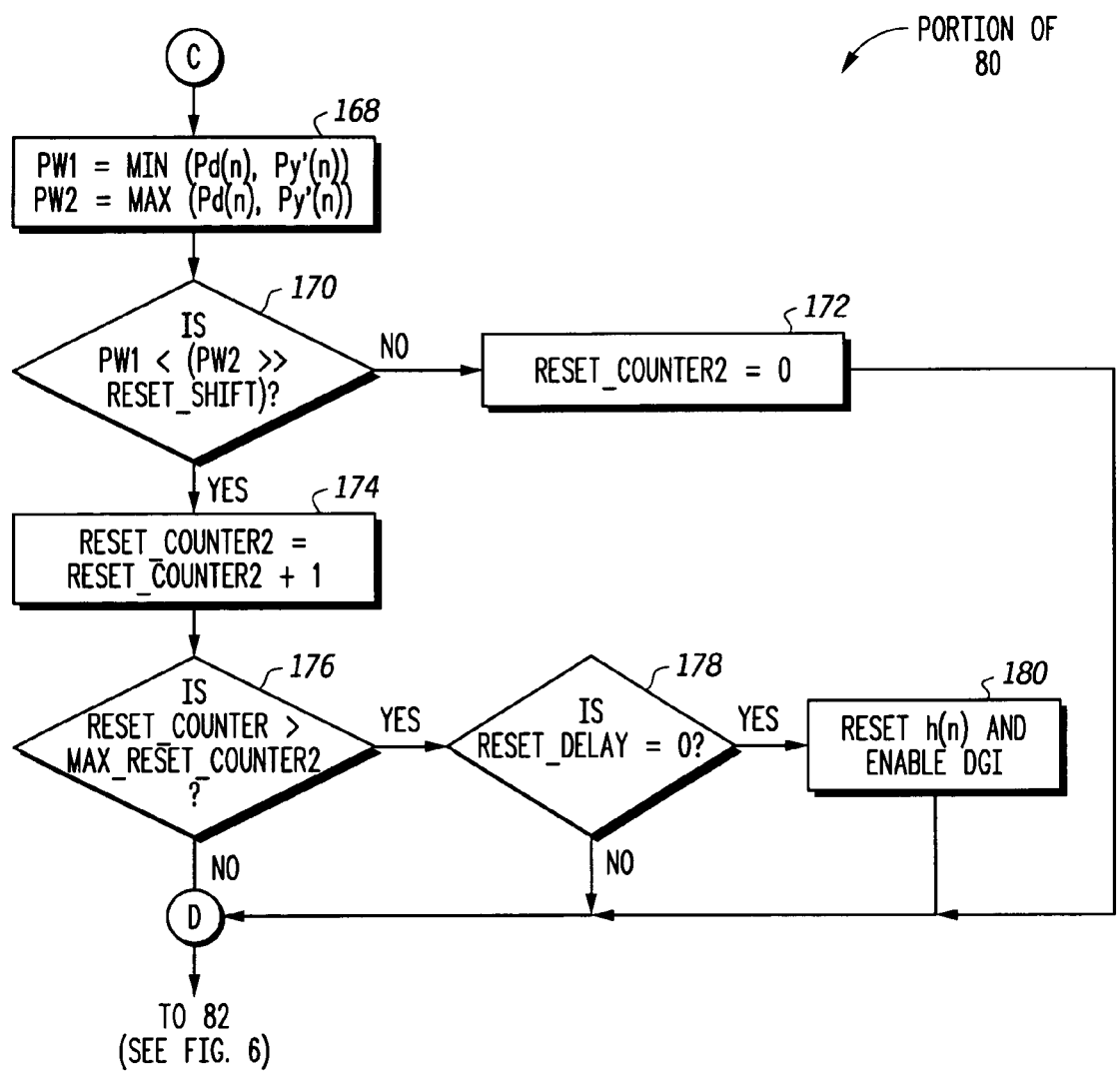

FIG. 11 includes a flow that illustrates one embodiment of a portion of block 80 of FIG. 6. From at least one point in FIG. 9, the flow 80 proceeds to circle C. From circle C, the flow proceeds to block 168 where PW1 is set equal to the minimum of Pd(n) and Py'(n), and PW2 is set equal to the maximum of Pd(n) and Py'(n). From block 168, the flow proceeds to decision diamond 170 where the question is asked "is PW1<(PW2 right shifted by the amount RESET_SHIFT)?" (e.g. RESET_SHIFT may be 1, which corresponds to 50 percent of PW2; alternatively, PW1 may be compared to see if it is less than PW2 times a ratio where the ratio may be, for example, 50 percent or 25 percent or 10 percent). If the answer to decision diamond 170 is no, the flow proceeds to block 172 where RESET_COUNTER2 is set to 0 and the flow proceeds to circle D. If the answer to decision diamond 170 is yes, the flow proceeds to block 174 where RESET_COUNTER2 is incremented by setting RESET_COUNTER2 equal to RESET_COUNTER2+1. From block 174, the flow proceeds to decision diamond 176 where the question is asked "is RESET_COUNTER>MAX_RESET_COUNTER2?" (e.g. MAX_RESET_COUNTER2=50*8). If the answer to decision diamond 176 is no, the flow proceeds to circle D. If the answer to decision diamond 176 is yes, the flow proceeds to decision diamond 178 where the question is asked "is RESET_DELAY equal to 0?". If the answer to decision diamond 178 is no, the flow proceeds to circle D. If the answer to decision diamond 178 is yes, the flow proceeds to block 180 where h(n) is reset and DGI is enabled. Therefore, RESET_DELAY may be used to ensure that the conditions (e.g. PW1<(PW2 right shifted by the amount RESET_SHIFT) are met for a predetermined amount of time. From circle D, the flow proceeds to block 82 (see FIG. 6).

Figure 12:
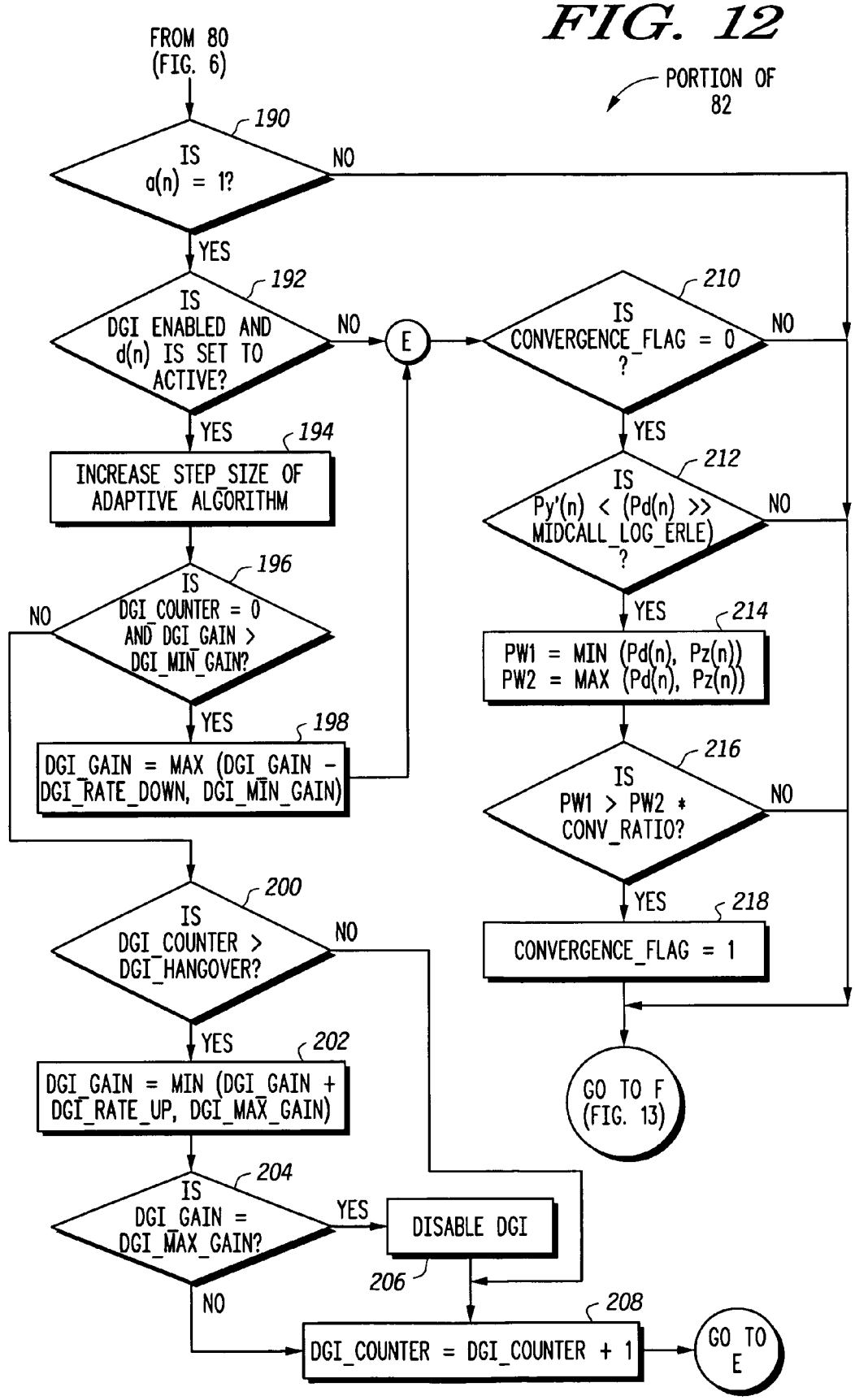

FIG. 12 includes a flow that illustrates one embodiment of a portion of block 82 of FIG. 6. From block 80 (see FIG. 6), the flow 82 proceeds to decision diamond 190 where the question is asked "is a(n) equal to 1?". If the answer to decision diamond 190 is no, the flow proceeds to circle F (see FIG. 13). If the answer to decision diamond 190 is yes, the flow proceeds to decision diamond 192 where the question is asked "is DGI enabled and is d(n) set to active?". If the answer to decision diamond 192 is no, the flow proceeds to circle E. If the answer to decision diamond 192 is yes, the flow proceeds to block 194 where the step size of the adaptive algorithm is increased. From block 194, the flow proceeds to decision diamond 196 where the question is asked "is DGI_COUNTER equal to 0, and is DGI_GAIN>DGI_MIN_GAIN?" (e.g. DGI_MIN_GAIN=0.00015). If the answer to decision diamond 196 is yes, the flow proceeds to block 198 where DGI_GAIN is set equal to the maximum value of (DGI_GAIN−DGI_RATE_DOWN) and DGI_MIN_GAIN (e.g. DGI_RATE_DOWN=0.0076). From block 198, the flow proceeds to circle E. If the answer to decision diamond 196 is no, the flow proceeds to decision diamond 200 where the question is asked "is DGI_COUNTER>DGI_HANGOVER?" (e.g. DGI_HANGOVER=1875*8). If the answer to decision diamond 200 is no, the flow proceeds to block 208 where the DGI_COUNTER is incremented by setting DGI_COUNTER equal to DGI_COUNTER+1. From block 208, the flow proceeds to circle E. If the answer to decision diamond 200 is yes, the flow proceeds to block 202 where DGI_GAIN is set equal to the minimum of (DGI_GAIN+DGI_RATE_UP) and DGI_MAX_GAIN (e.g. DGI_RATE_UP=0.0012). From block 202, the flow proceeds to decision diamond 204 where the question is asked "is DGI_GAIN equal to DGI_MAX_GAIN?". If the answer to decision diamond 204 is no, the flow proceeds to block 208 where the DGI_COUNTER is incremented by setting DGI_COUNTER equal to DGI_COUNTER+1. If the answer to decision diamond 204 is yes, the flow proceeds to block 206 where DGI is disabled. From block 206, the flow proceeds to block 208, which is described above.

From circle E, the flow proceeds to decision diamond 210 where the question is asked "is CONVERGENCE_FLAG equal to 0?". If the answer to decision diamond 210 is no, the flow proceeds to circle F (see FIG. 13). If the answer to decision diamond 210 is yes, the flow proceeds to decision diamond 212 where the question is asked "is Py'(n)<(Pd(n) right shifted by the amount MIDCALL_LOG_ERLE)?" (e.g. MIDCALL_LOG_ERLE=10). If the answer to decision diamond 212 is no, the flow proceeds to circle F (see FIG. 13). If the answer to decision diamond 212 is yes, the flow proceeds to block 214 where PW1 is set equal to the minimum of Pd(n) and Pz(n), and PW2 is set equal to the maximum of Pd(n) and Pz(n). From block 214, the flow proceeds to decision diamond 216 where the question is asked "is PW1>PW2*CONV_RATIO?" (e.g. CONV_RATIO=0.99). If the answer to decision diamond 216 is no, the flow proceeds to circle F (see FIG. 13). If the answer to decision diamond 216 is yes, the flow proceeds to block 218 where the CONVERGENCE_FLAG is set equal to 1. From block 218, the flow proceeds to circle F (see FIG. 13).

Figure 13:
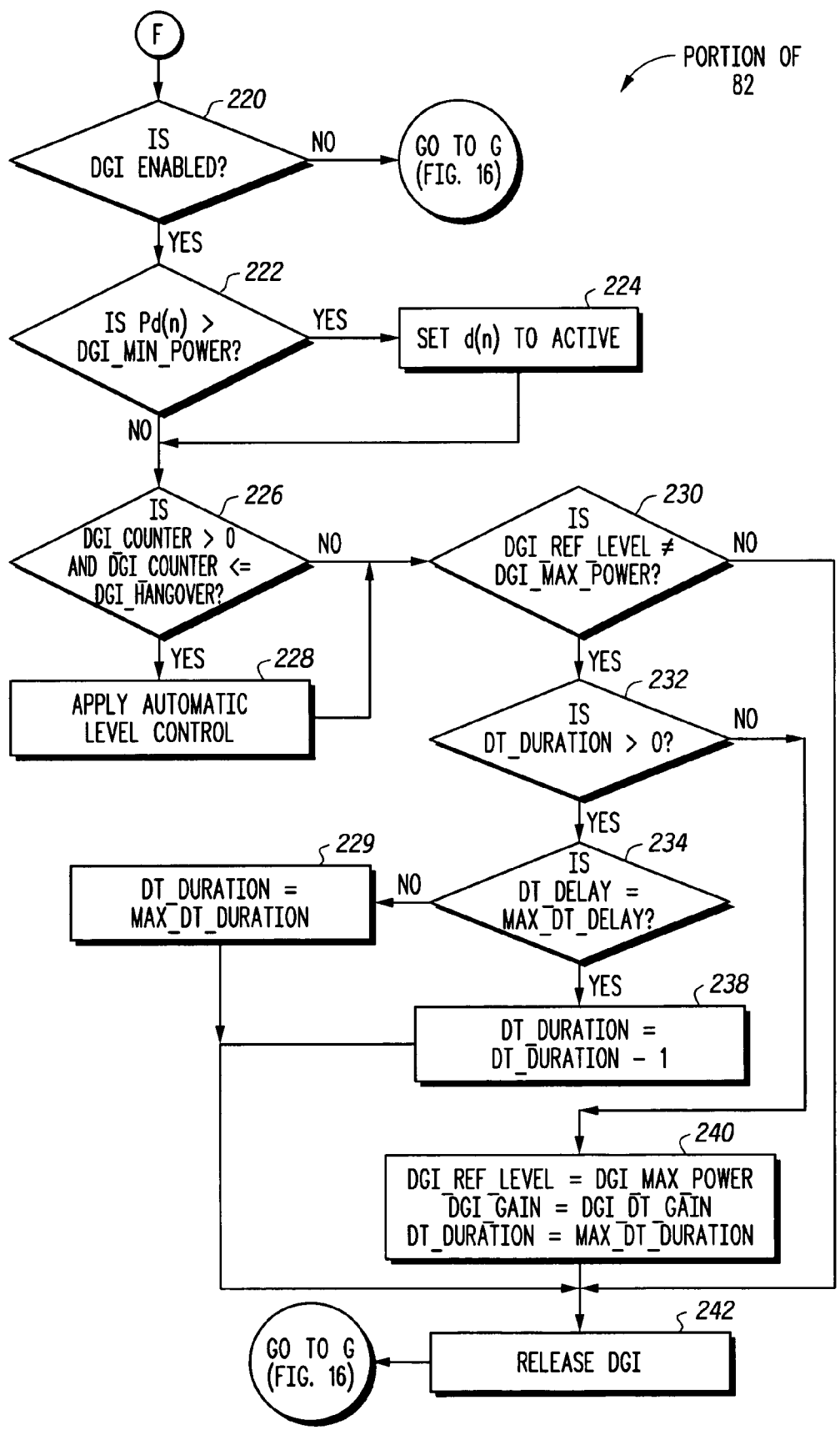

FIG. 13 includes a flow that illustrates one embodiment of a portion of block 82 of FIG. 6. From at least one point in FIG. 12, the flow 82 proceeds to decision diamond 220 where the question is asked "is DGI enabled?". If the answer to decision diamond 220 is no, the flow proceeds to circle G (see FIG. 16). If the answer to decision diamond 220 is yes, the flow proceeds to decision diamond 222 where the question is asked "is Pd(n)>DGI_MIN_POWER?" (e.g. DGI_MIN_POWER=−59 dBm0). If the answer to decision diamond 222 is yes, the flow proceeds to block 224 where d(n) is set to active (e.g. is asserted), and the flow then proceeds to decision diamond 226. If the answer to decision diamond 222 is no, the flow proceeds to decision diamond 226 where the question is asked "is DGI_COUNTER>0 and DGI_COUNTER<=DGI_HANGOVER?". If the answer to decision diamond 226 is yes, the flow proceeds to block 228 where automatic level control is applied, and the flow then proceeds to decision diamond 230. If the answer to decision diamond 226 is no, the flow proceeds to decision diamond 230 where the question is asked "is DGI_REF_LEVEL not equal to DGI_MAX_POWER?" (e.g. DGI_MAX_POWER=0 dBm0). If the answer to decision diamond 230 is no, the flow proceeds to block 242 where DGI is released. In one embodiment, DGI is released at block 242 in response to detecting whether a near-end signal is present or whether any other uncorrelated noise is present in the desired signal d(n). If the answer to decision diamond 230 is yes, the flow proceeds to decision diamond 232 where the question is asked "is DT_DURATION>0?". If the answer to decision diamond 232 is no, the flow proceeds to block 240 where DGI_REF_LEVEL is set equal to DGI_MAX_POWER, DGI_GAIN is set equal to DGI_DT_GAIN (e.g. $1-2^{-5}$), and DT_DURATION is set equal to MAX_DT_DURATION (e.g. 5*8). From block 240, the flow proceeds to block 242. If the answer to decision diamond 232 is yes, the flow proceeds to decision diamond 234 where the question is asked "is DT_DELAY equal to MAX_DT_DELAY?" (e.g. 20*8). If the answer to decision diamond 234 is no, the flow proceeds to block 229 where DT_DURATION is set equal to MAX_DT_DURATION. From block 229, the flow proceeds to block 242. If the answer to decision diamond 234 is yes, the flow proceeds to block 238 where DT_DURATION is set equal to DT_DURATION−1. From block 238, the flow proceeds to block 242. From block 242, the flow proceeds to circle G (see FIG. 16)

Figure 14:
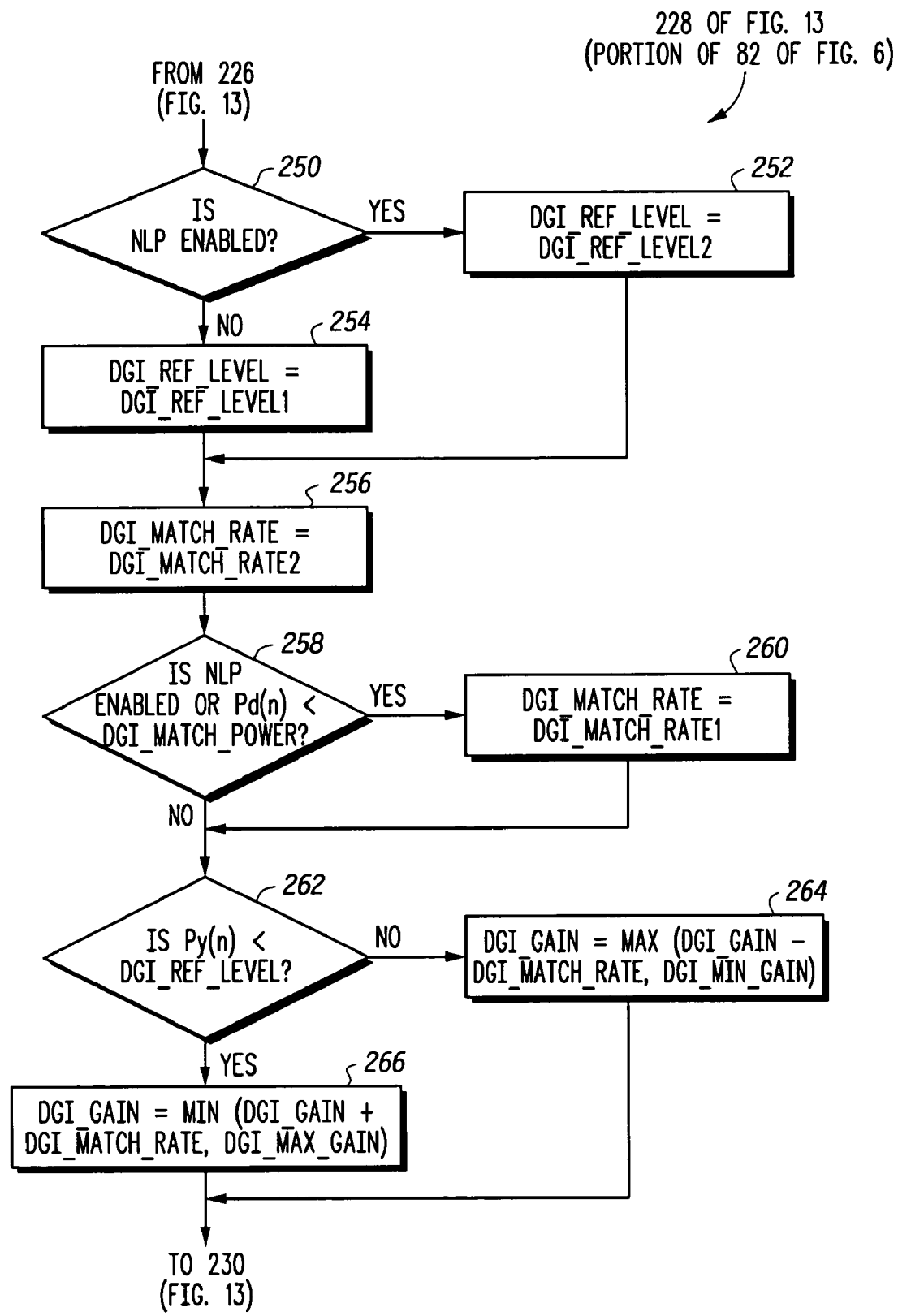

FIG. 14 includes a-flow that illustrates one embodiment of block 228 of FIG. 13, which is also a portion of block 82 of FIG. 6. From decision diamond 226 in FIG. 13, the flow proceeds to decision diamond 250 where the question is asked "is NLP (nonlinear processing) enabled?". If the answer to decision diamond 250 is no, the flow proceeds to block 254 where DGI_REF_LEVEL is set equal to DGI_REF_LEVEL1. If the answer to decision diamond 250 is yes, the flow proceeds to block 252 where DGI_REF_LEVEL is set equal to DGI_REF_LEVEL2. From both blocks 252 and 254, the flow proceeds to block 256 where the DGI_MATCH_RATE is set equal to DGI_MATCH_RATE2 (e.g. 0.000061). From block 256, the flow proceeds to decision diamond 258 where the question is asked "is NLP enabled or is Pd(n)<DGI_MATCH_POWER?" (e.g. −30 dBm0). If the answer to decision diamond 258 is yes, the flow proceeds to block 260 where DGI_MATCH_RATE is set equal to DGI_MATCH_RATE1 (e.g. 0.000031). From block 260, the flow then proceeds to decision diamond 262. If the answer to decision diamond 258 is no, the flow proceeds to decision diamond 262 where the question is asked "is Py(n)<DGI_REF_LEVEL?". If the answer to decision diamond 262 is no, the flow proceeds to block 264 where DGI_GAIN is set equal to the maximum value of (DGI_GAIN−DGI_MATCH_RATE) and DGI_MIN_GAIN. If the answer to decision diamond 262 is yes, the flow proceeds to block 266 where DGI_GAIN is set equal to the minimum value of (DGI_GAIN+DGI_MATCH_RATE) and DGI_MAX_GAIN. From both blocks 266 and 264, the flow proceeds to decision diamond 230 (see FIG. 13).

Figure 15:
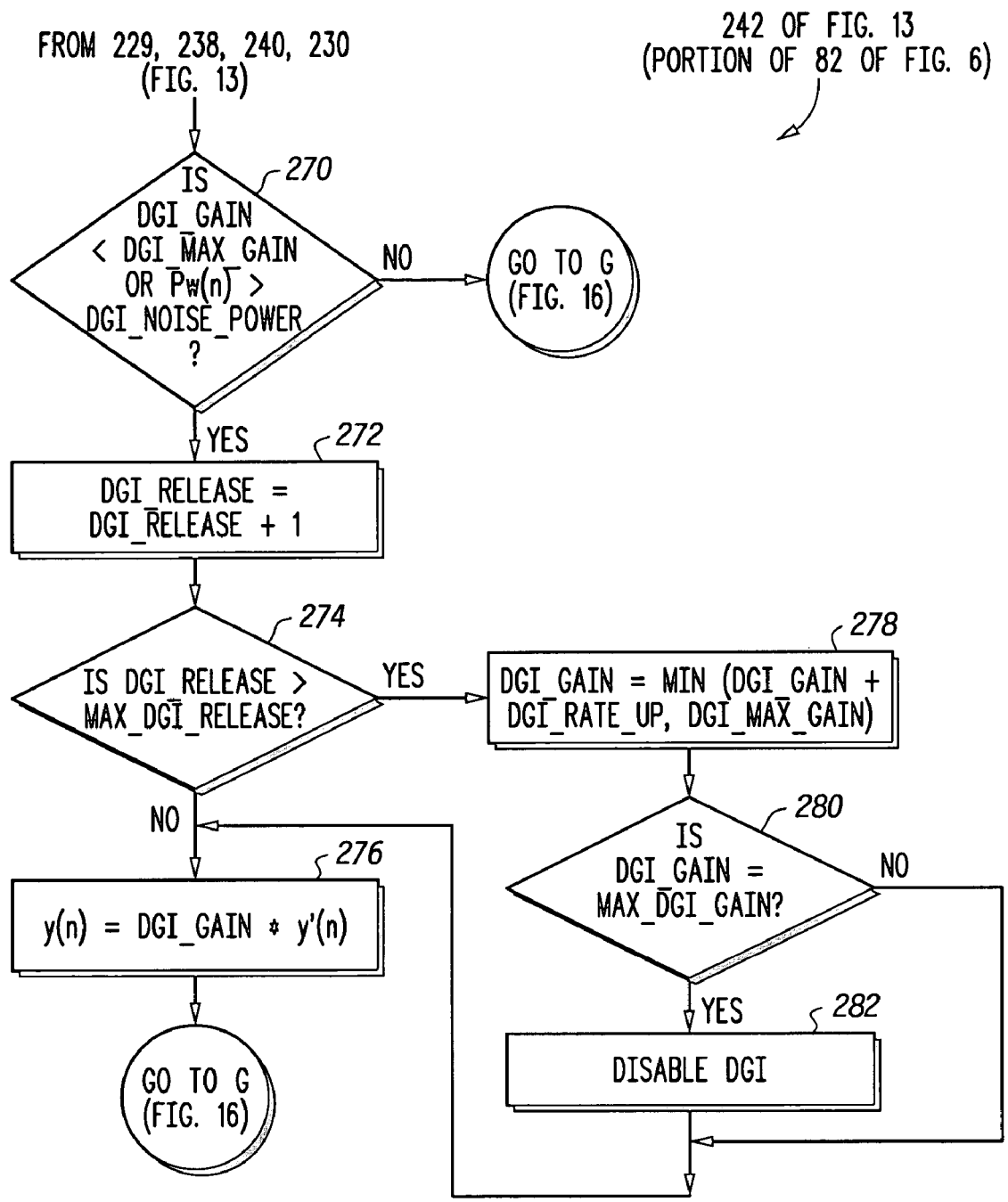

FIG. 15 includes a flow that illustrates one embodiment of block 242 of FIG. 13, which is also a portion of block 82 of FIG. 6. From decision diamond 230 and blocks 229, 238, and 240 in FIG. 13, the flow proceeds to decision diamond 270 where the question is asked "is DGI_GAIN<DGI_MAX_GAIN or is Pw(n)>DGI_NOISE_POWER?" (e.g. DGI_NOISE_POWER=−45 dBm0). If the answer to decision diamond 270 is no, the flow proceeds circle G (see FIG. 16). If the answer to decision diamond 270 is yes, the flow proceeds to block 272 where DGI_RELEASE is set equal to DGI_RELEASE+1. From block 272, the flow proceeds to decision diamond 274 where the question is asked "is DGI_RELEASE>MAX_DGI_RELEASE?" (e.g. MAX_DGI_RELEASE=2500*8). If the answer to decision diamond 274 is no, the flow proceeds block 276 where y(n) is set equal to DGI_GAIN*y'(n). If the answer to decision diamond 274 is yes, the flow proceeds to block 278 where DGI_GAIN is set equal to the minimum of (DGI_GAIN+DGI_RATE_UP) and DGI_MAX_GAIN. From block 278, the flow then proceeds to decision diamond 280 where the question is asked "is DGI_GAIN equal to MAX_DGI_GAIN?". If the answer to decision diamond 280 is no, the flow proceeds to block 276. If the answer to decision diamond 280 is yes, the flow proceeds to block 282 where DGI is disabled. From block 282, the flow proceeds to block 276. From block 276, the flow proceeds to circle G (see FIG. 16).

Figure 16:
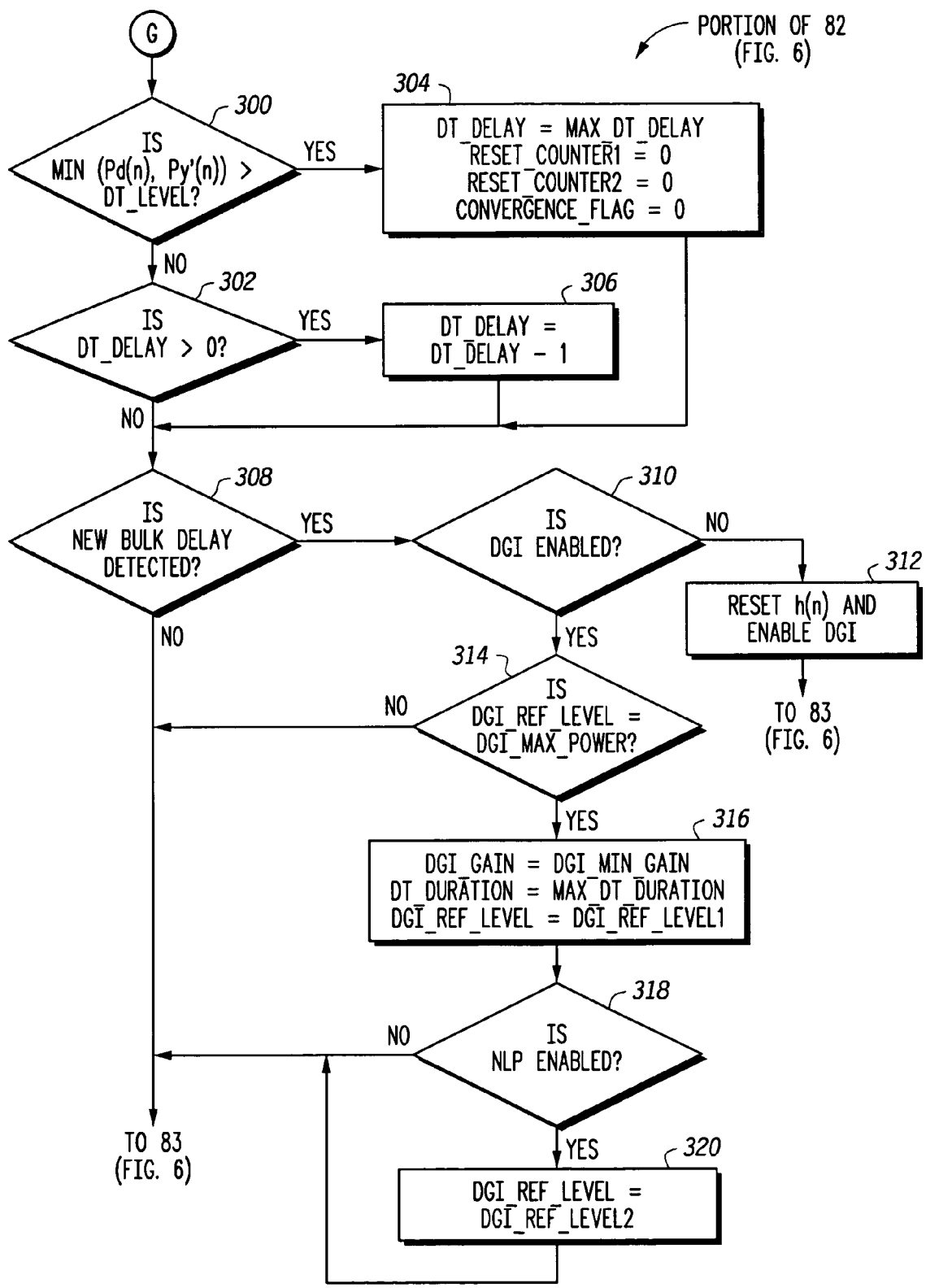

FIG. 16 includes a flow that illustrates one embodiment of a portion of block 82 of FIG. 6. From a plurality of points in FIGS. 13 and 15, the flow illustrated in FIG. 16 proceeds from circle G to decision diamond 300 where the question is asked "is the minimum of Pd(n) and Py'(n)>DT_LEVEL?". If the answer to decision diamond 300 is yes, the flow proceeds to block 304 where DT_DELAY is set equal to MAX_DT_DELAY, RESET_COUNTER1 is set equal to 0, RESET_COUNTER2 is set equal to 0, and CONVEREGNCE_FLAG is set equal to 0. For one embodiment, the flow from decision diamond 300 to block 304 corresponds to detecting the near-end signal, which is a portion of the desired signal that is not correlated with the reference signal. From block 304, the flow proceeds to decision diamond 308. If the answer to decision diamond 300 is no, the flow proceeds to decision diamond 302 where the question is asked "is DT_DELAY>0?". If the answer to decision diamond 302 is yes, the flow proceeds to block 306 where DT_DELAY is set equal to DT_DEALY−1, and the flow then proceeds to decision diamond 308. If the answer to decision diamond 302 is no, the flow proceeds to decision diamond 308 where the question is asked "is a new bulk delay detected?". If the answer to decision diamond 308 is no, the flow proceeds to decision diamond 83 of FIG. 6. If the answer to decision diamond 308 is yes, the flow proceeds to decision diamond 310 where the question is asked "is DGI enabled?". If the answer to decision diamond 310 is no, the flow proceeds to block 312 where h(n) is reset and DGI is enabled. From block 312, the flow proceeds to block 83 of FIG. 6. If the answer to decision diamond 310 is yes, the flow proceeds to decision diamond 314 where the question is asked "is DGI_REF_LEVEL equal to DGI_MAX_POWER?". If the answer to decision diamond 314 is no, the flow proceeds to block 83 of FIG. 6. If the answer to decision diamond 314 is yes, the flow proceeds to block 316 where DGI_GAIN is set equal to DGI_MIN_GAIN, DT_DURATION is set equal to MAX_DT_DURATION, and DGI_REF_LEVEL is set equal to DGI_REF_LEVEL1. From block 316, the flow proceeds to decision diamond 318 where the question is asked "is NLP enabled?". If the answer to decision diamond 318 is no, the flow proceeds to block 83 of FIG. 6. If the answer to decision diamond 318 is yes, the flow proceeds to block 320 where DGI_REF_LEVEL is set equal to DGI_REF_LEVEL2. From block 320, the flow proceeds to block 83 of FIG. 6.

FIG. 17 includes a flow that illustrates one embodiment of a portion of block 80 of FIG. 6. From decision diamond 128 of FIG. 9, the flow illustrated in FIG. 17 proceeds from circle H to block 340 where adaptive filter backups are processed. The flow then proceeds to block 342 where a distance between the current adaptive filter and previous backups is computed. The flow then proceeds to block 344 where an abrupt change of the adaptive filter is checked. The flow then proceeds to block 346 where DT_LEVEL is updated. The flow then proceeds to block 83 of FIG. 6.

Figure 18:
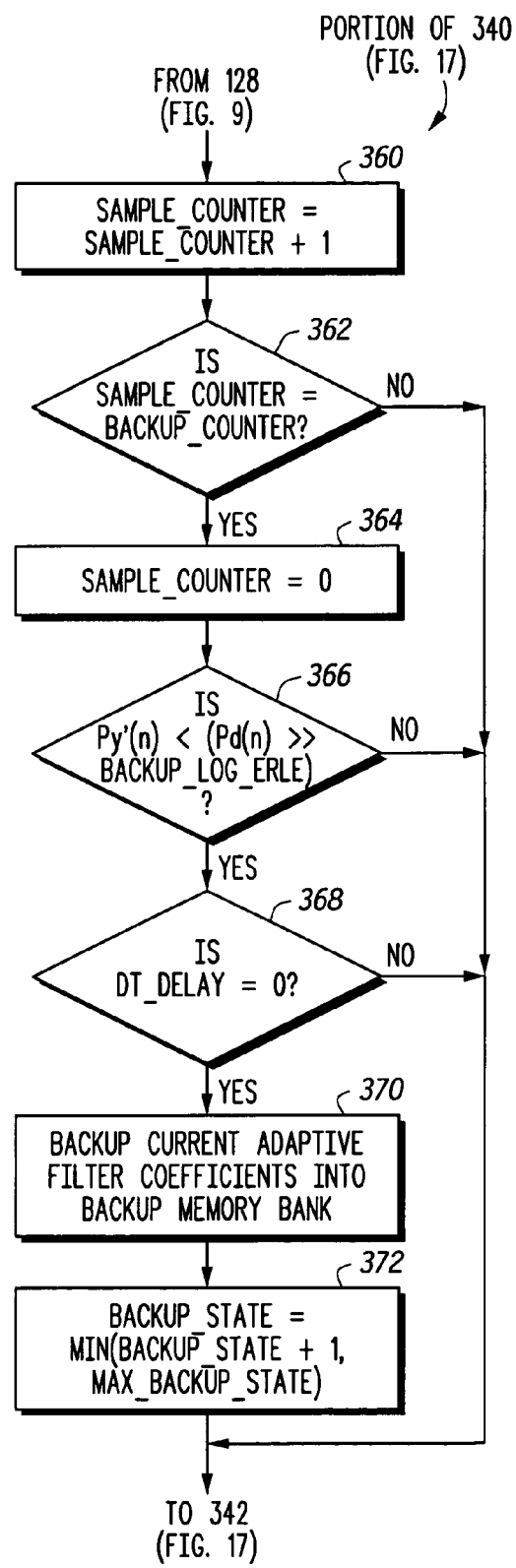

FIG. 18 includes a flow that illustrates one embodiment of a portion of block 340 of FIG. 17. From decision diamond 128 of FIG. 9, the flow illustrated in FIG. 18 proceeds to block 360 where SAMPLE_COUNTER is set equal to SAMPLE_COUNTER+1. From block 360, the flow proceeds to decision diamond 362 where the question is asked "is SAMPLE_COUNTER equal to BACKUP_COUNTER?" (e.g. BACKUP_COUNTER=2000*8). If the answer to decision diamond 362 is no, the flow proceeds to block 342 of FIG. 17. If the answer to decision diamond 362 is yes, the flow proceeds to block 364 where SAMPLE_COUNTER is set to 0. From block 364, the flow proceeds to decision diamond 366 where the question is asked ", is Py'(n)<(Pd(n) right shifted by the amount BACKUP_LOG_ERLE)?" (e.g. BACKUP_LOG_ERLE=6). If the answer to decision diamond 366 is no, the flow proceeds to block 342 of FIG. 17. If the answer to decision diamond 366 is yes, the flow proceeds to decision diamond 368 where the question is asked "is DT_DELAY equal to 0". If the answer to decision diamond 368 is no, the flow proceeds to block 342 of FIG. 17. If the answer to decision diamond 368 is yes, the flow proceeds to block 370 where the current adaptive filter coefficients are backed-up into a backup memory bank. From block 370, the flow proceeds to block 372 where BACKUP_STATE is set equal to the minimum of (BACKUP_STATE+1) and MAX_BACKUP_STATE (e.g. 3). From block 372, the flow proceeds to block 342 of FIG. 17.

Figure 19:
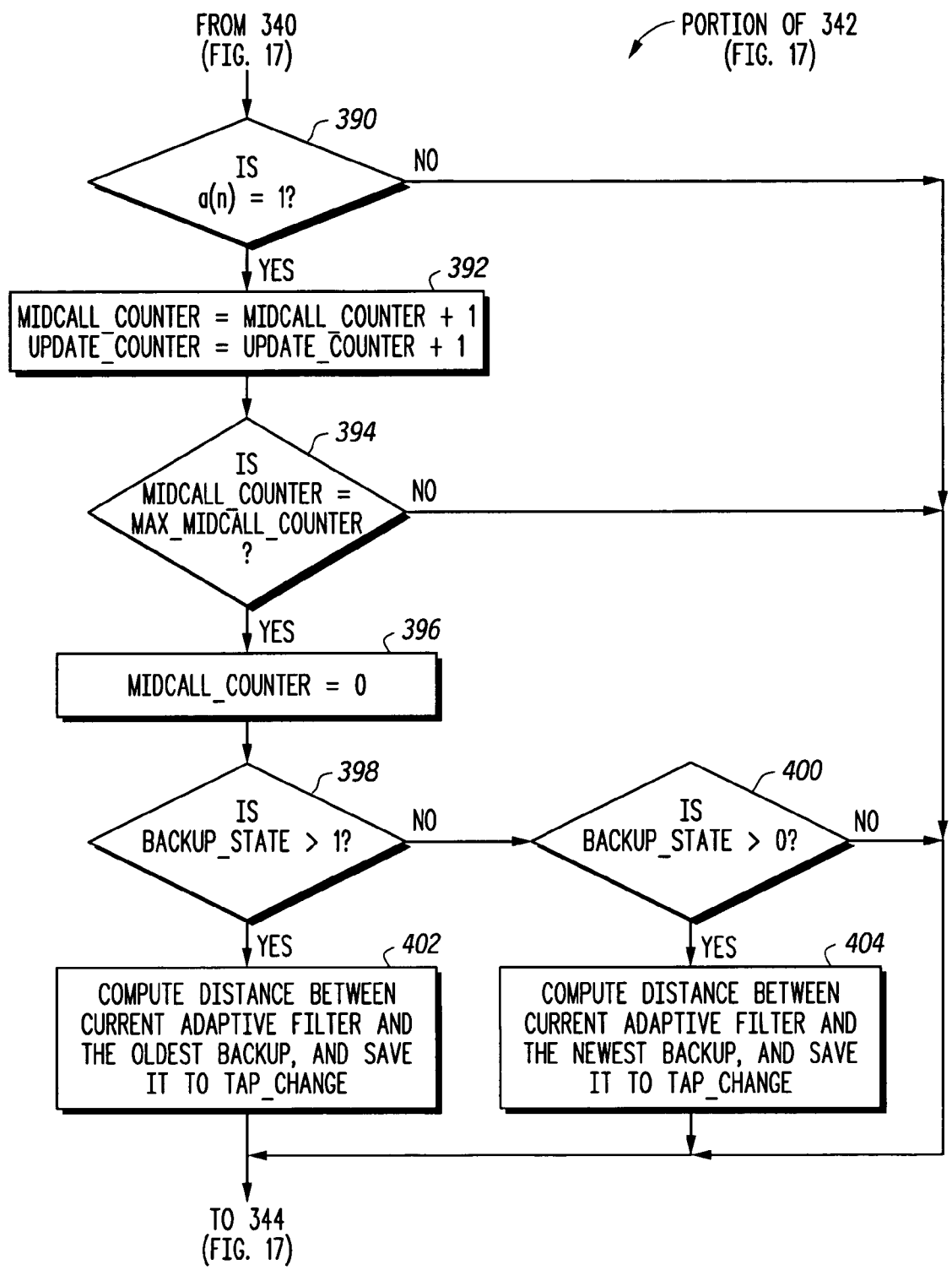

FIG. 19 includes a flow that illustrates one embodiment of a portion of block 342 of FIG. 17. From block 340 of FIG. 17, the flow illustrated in FIG. 19 proceeds to decision diamond 390 where the question is asked "is a(n) equal to 1?". If the answer to decision diamond 390 is no, the flow proceeds to block 344 of FIG. 17. If the answer to decision diamond 390 is yes, the flow proceeds to block 392 where MIDCALL_COUNTER is set equal to MIDCALL_COUNTER+1, and UPDATE_COUNTER is set equal to UPDATE_COUNTER+1. From block 392, the flow proceeds to decision diamond 394 where the question is asked "is MIDCALL_COUNTER equal to MAX_MIDCALL_COUNTER?" (e.g. MAX_MIDCALL_COUNTER=4). If the answer to decision diamond 394 is no, the flow proceeds to block 344 of FIG. 17. If the answer to decision diamond 394 is yes, the flow proceeds to block 396 where MIDCALL_COUNTER is set equal to 0. From block 396, the flow proceeds to decision diamond 398 where the question is asked "is BACKUP_STATE>1?". If the answer to decision diamond 398 is yes, the flow proceeds to block 402 where the distance between the current adaptive filter and the oldest backup is computed and saved to TAP_CHANGE. If the answer to decision diamond 398 is no, the flow proceeds to decision diamond 400 where the question is asked "is BACKUP_STATE>0?". If the answer to decision diamond 400 is no, the flow proceeds to block 344 of FIG. 17. If the answer to decision diamond 400 is yes, the flow proceeds to block 404 where the distance between the current adaptive filter and the newest backup is computed and saved to TAP_CHANGE. From blocks 404 and 402, the flow proceeds to block 344 of FIG. 17.

Figure 20:
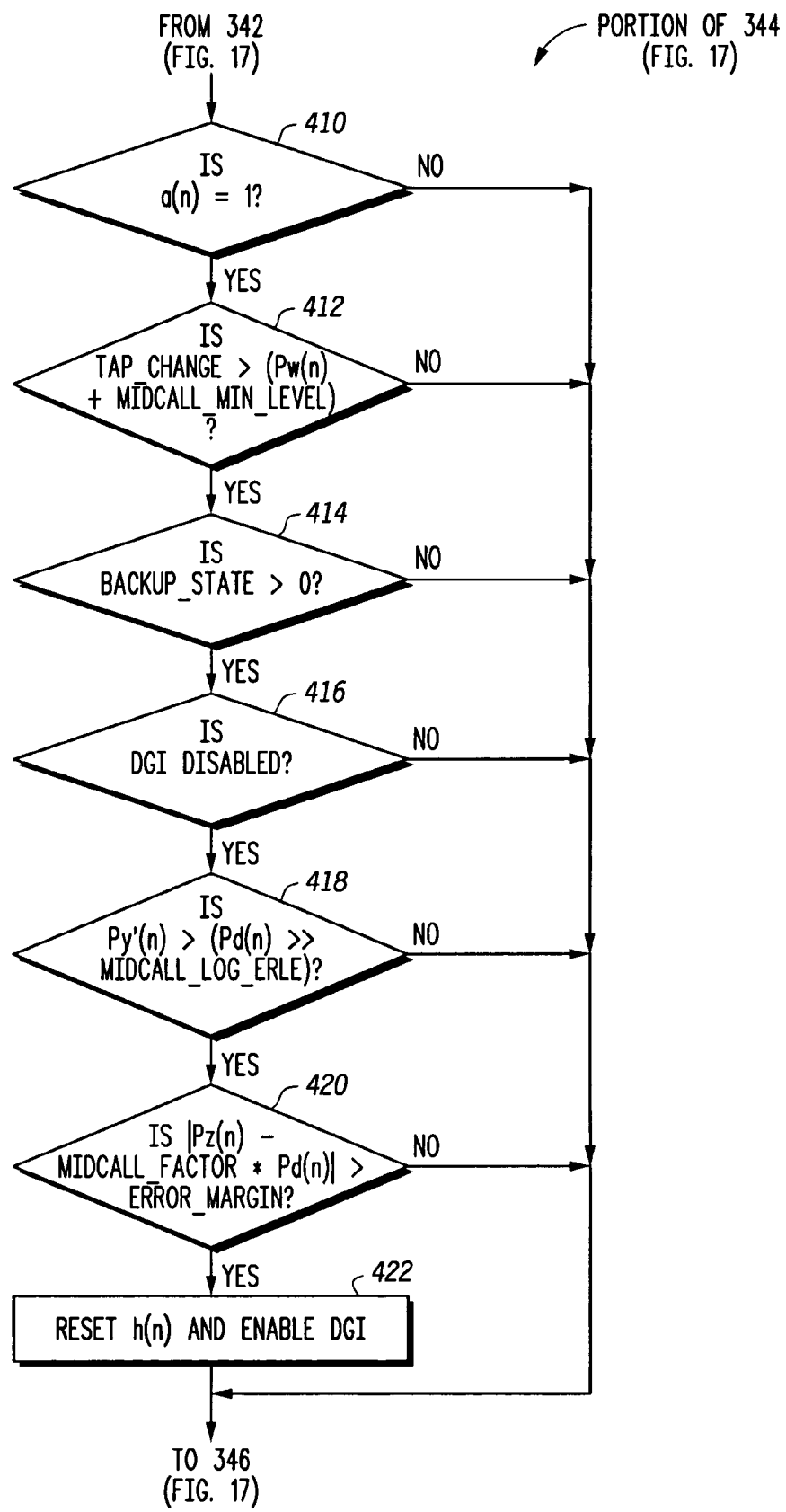

FIG. 20 includes a flow that illustrates one embodiment of a portion of block 344 of FIG. 17. From block 342 of FIG. 17, the flow illustrated in FIG. 20 proceeds to decision diamond 410 where the question is asked "is a(n) equal to 1?". If the answer to decision diamond 410 is no, the flow proceeds to block 346 of FIG. 17. If the answer to decision diamond 410 is yes, the flow proceeds to decision diamond 412 where the question is asked "is TAP_CHANGE>[Pw(n)+MIDCALL_MIN_LEVEL]?" (e.g. MIDCALL_MIN_LEVEL=0.0076). If the answer to decision diamond 412 is no, the flow proceeds to block 346 of FIG. 17. If the answer to decision diamond 412 is yes, the flow proceeds to decision diamond 414 where the question is asked "is BACKUP_STATE>0?". If the answer to decision diamond 414 is no, the flow proceeds to block 346 of FIG. 17. If the answer to decision diamond 414 is yes, the flow proceeds to decision diamond 416 where the question is asked "is DGI disabled?". If the answer to decision diamond 416 is no, the flow proceeds to block 346 of FIG. 17. If the answer to decision diamond 416 is yes, the flow proceeds to decision diamond 418 where the question is asked "is Py'(n)>(Pd(n) right shifted by the amount MIDCALL_LOG_ERLE)?" (e.g. MIDCALL_LOG_ERLE=2). If the answer to decision diamond 418 is no, the flow proceeds to block 346 of FIG. 17. If the answer to decision diamond 418 is yes, the flow proceeds to decision diamond 420 where the question is asked "is the magnitude of [Pz(n)−MIDCALL_FACTOR*Pd(n)]>ERROR_MARGIN?" (e.g. MIDCALL_FACTOR=1 and ERROR_MARGIN=Pd(n)/8). If the answer to decision diamond 420 is no, the flow proceeds to block 346 of FIG. 17. If the answer to decision diamond 420 is yes, the flow proceeds to block 422 where h(n) is reset and DGI is enabled. From block 422, the flow proceeds to block 346 of FIG. 17.

Figure 21:
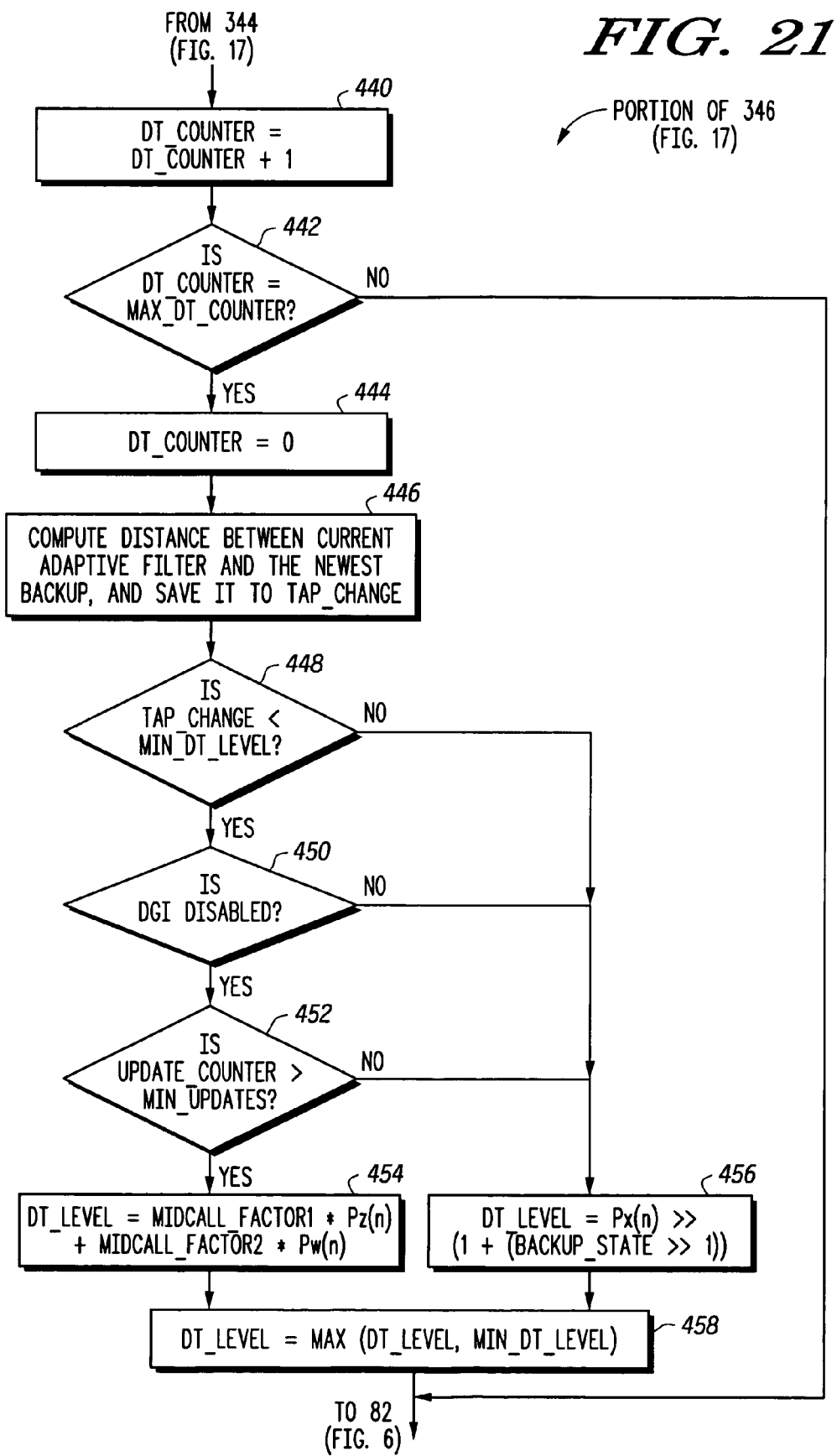

FIG. 21 includes a flow that illustrates one embodiment of a portion of block 346 of FIG. 17. From block 344 of FIG. 17, the flow illustrated in FIG. 21 proceeds to block 440 where DT_COUNTER is set equal to DT_COUNTER+1. From block 440, the flow proceeds to decision diamond 442 where the question is asked "is DT_COUNTER equal to MAX_DT_COUNTER?" (e.g. MAX_DT_COUNTER=4). If the answer to decision diamond 442 is no, the flow proceeds to block 82 of FIG. 6. If the answer to decision diamond 442 is yes, the flow proceeds to block 444 where DT_COUNTER is set equal to 0. From block 444, the flow proceeds to block 446 where the distance between the current adaptive filter and the newest backup is computed and saved to TAP_CHANGE. From block 446, the flow proceeds to decision diamond 448 where the question is asked "is TAP_CHANGE<MIN_DT_LEVEL?" (e.g. MIN_DT_LEVEL=0.0025). If the answer to decision diamond 448 is no, the flow proceeds to block 456 where DT_LEVEL is set equal to [Px(n) right shifted by the amount (1+VALUE1)], where VALUE1 is equal to BACKUP_STATE right shifted by one. Generally, DT_LEVEL can be a polynomial function of Px(n) in this case. If the answer to decision diamond 448 is yes, the flow proceeds to decision diamond 450 where the question is asked "is DGI disabled?". If the answer to decision diamond 450 is no, the flow proceeds to block 456. If the answer to decision diamond 450 is yes, the flow proceeds to decision diamond 452 where the question is asked "is UPDATE_COUNTER>MIN_UPDATES?" (e.g. MIN_UPDATES=2000*8). If the answer to decision diamond 452 is no, the flow proceeds to block 456. If the answer to decision diamond 452 is yes, the flow proceeds to block 454 where DT_LEVEL is set equal to [MIDCALL_FACTOR1 *Pz(n)+ MIDCALL_FACTOR2 *Pw(n)] (e.g. MIDCALL_FACTOR1=1.25 and MIDCALL_FACTOR2=4). Generally, DT_LEVEL can be a polynomial function of Pz(n) and Pw(n) in this case, which typically improves near-end signal detection on decision diamond 300 of FIG. 16, especially after the adaptive filter has converged (i.e. c(n)=1). From blocks 454 and 456, the flow proceeds to block 458 where DT_LEVEL is set equal to the maximum of DT_LEVEL and MIN_DT_LEVEL (e.g. MIN_DT_LEVEL=−42 dBm0). From block 458, the flow proceeds to block 82 of FIG. 6.

Figure 22:
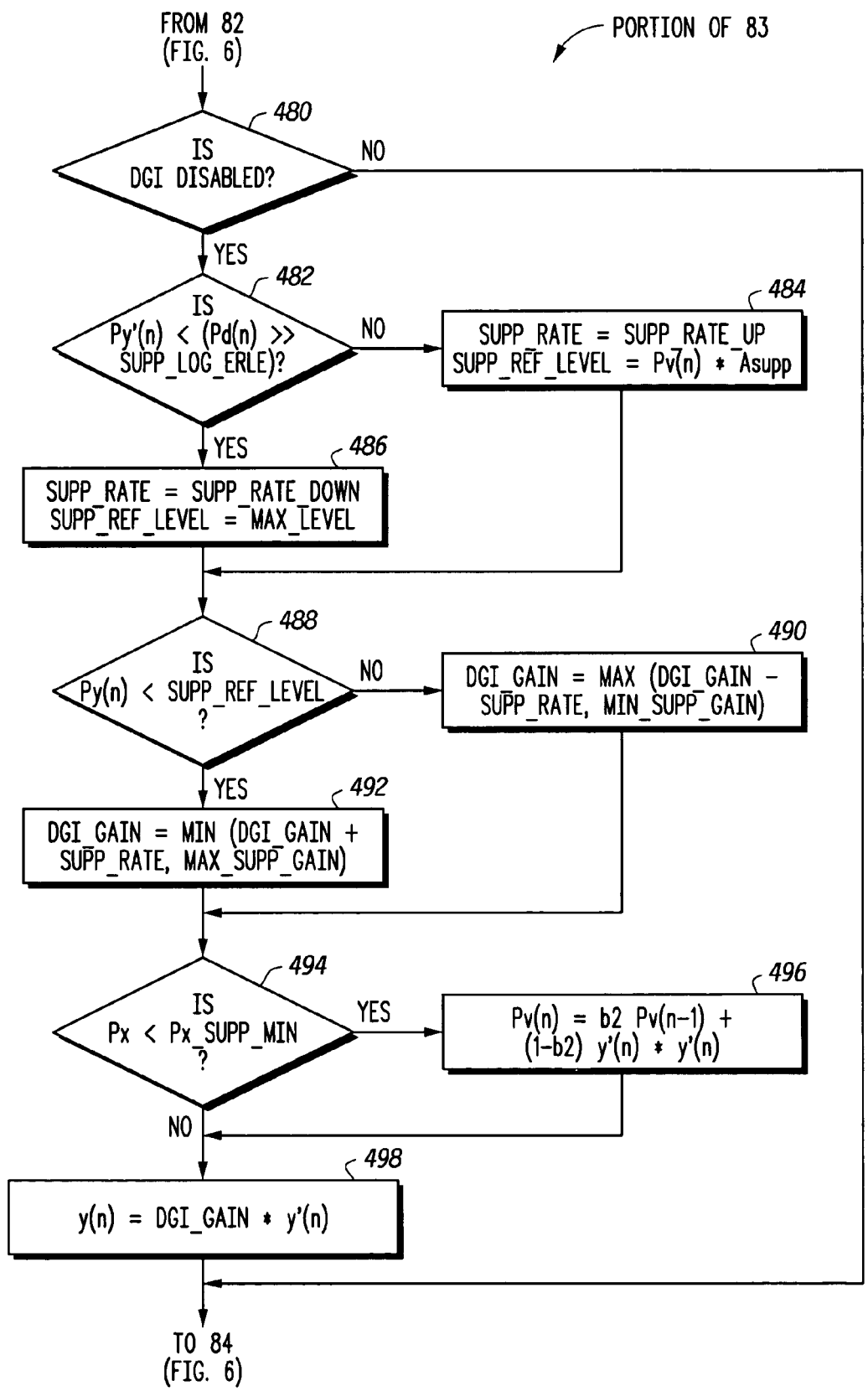

FIG. 22 includes a flow that illustrates one embodiment of a portion of block 83 of FIG. 6. From block 82 of FIG. 6, the flow illustrated in FIG. 22 proceeds to decision diamond 480 where the question is asked "is DGI disabled?". If the answer to decision diamond 480 is no, the flow proceeds to block 84 of FIG. 6. If the answer to decision diamond 480 is yes, the flow proceeds to decision diamond 482 where the question is asked "is Py'(n)<[Pd(n) right shifted by the amount SUPP_LOG ERLE]?" (e.g. SUPP_LOG_ERLE=3). Generally, the test on decision diamond 482 can be based on a polynomial function of Py'(n) and Pd(n), wherein the sign of the polynomial function is used to define a proper gain adjustment rate and reference level. If the answer to decision diamond 482 is no, the flow proceeds to block 484 where SUPP_RATE is set equal to SUPP_RATE_UP (e.g. 0.0012), and SUPP_REF_LEVEL is set equal to Pv(n)*Asupp (e.g. Asupp=½). If the answer to decision diamond 482 is yes, the flow proceeds to block 486 where SUPP_RATE is set equal to SUPP_RATE_DOWN (e.g. 0.0076), and SUPP_REF_LEVEL is set equal to MAX_LEVEL (e.g. 0 dBmO). From blocks 486 and 484, the flow proceeds to decision diamond 488 where the question is asked "is Py(n)<SUPP_REF_LEVEL?". If the answer to decision diamond 488 is no, the flow proceeds to block 490 where DGI_GAIN is set equal to the maximum of (DGI_GAIN−SUPP_RATE) and MIN_SUPP_GAIN (e.g. MIN_SUP_GAIN=$2^{-15}$). If the answer to decision diamond 488 is yes, the flow proceeds to block 492 where DGI_GAIN is set equal to the minimum of (DGI_GAIN+SUPP_RATE) and MAX_SUPP_GAIN (e.g. MAX_SUPP_GAIN=$1-2^{-15}$). From blocks 492 and 490, the flow proceeds to decision diamond 494 where the question is asked "is Px(n)<Px_SUPP_MIN?" (e.g. Px_SUPP_MIN=−27 dBm0). If the answer to decision diamond 494 is yes, the flow proceeds to block 496 where Pv(n) is set equal to b2 Pv(n−1)+(1−b2) y'(n)*y'(n) (e.g. b2=1−2−9). From block 496, the flow proceeds to block 498 where y(n) is set equal to DGI_GAIN*y'(n). If the answer to decision diamond 494 is no, the flow proceeds to block 498. From block 498, the flow proceeds to block 84 of FIG. 6.

In the foregoing specification, the invention has been described with reference to specific embodiments. However, one of ordinary skill in the art appreciates that various modifications and changes can be made without departing from the scope of the present invention as set forth in the claims below. For example, any of the methods taught herein may be embodied as software on one or more of computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also, the block diagrams may different blocks than those illustrated and may have more or less blocks or be arranged differently. Also, the flow diagrams may also be arranged differently, include more or less steps, be arranged differently, or may have steps that can be separated into multiple steps or steps that can be performed simultaneously with one another. Accordingly, the specification and figures are to be regarded in an illustrative rather than a restrictive sense, and all such modifications are intended to be included within the scope of present invention.

Note that elements illustrated herein may have intervening elements not illustrated that couple the illustrated elements. The term coupled, as used herein, is defined as joined or linked, although not necessarily directly, and not necessarily mechanically.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for dynamically inserting gain in an adaptive filter system, comprising:
receiving a desired signal generated by communication system; receiving a reference signal;
filtering the reference signal filtering the reference signal using an adaptive filter to provide an estimated desired signal;
generating an error signal based on the desired and estimated desired signals; and
applying a predetermined gain function to the error signal during a predetermined period of time to produce an output signal,
wherein the predetermined period of time for applying the predetermined gain function is independent of the error signal.

2. The method of claim 1, further comprising detecting an abrupt change in the desired signal, wherein applying the predetermined gain function is performed in response to detecting the abrupt change.

3. The method of claim 1, wherein applying the predetermined gain function is performed after the desired signal surpasses an initial threshold value.

4. The method of claim 1, wherein the predetermined period of time comprises a speed-up period, a hang-over period, and a release period.

5. The method of claim 4, wherein at a start of the predetermined period of time, the predetermined gain function is at a first gain level, and during the speed-up period, the predetermined gain function is reduced to a second gain level.

6. The method of claim 5, wherein during the speed-up period, the predetermined gain function is reduced by at least 25 percent.

7. The method of claim 5, wherein the speed-up period is at least 1 percent and at most 4 percent of the predetermined period of time.

8. The method of claim 5, wherein during the hang-over period, a level of the output signal is maintained at a target level.

9. The method of claim 8, wherein during the release period, the predetermined gain function is restored to the first gain level.

10. The method of claim 9, wherein the predetermined gain function is gradually increased to the first gain level and wherein the release period is at least 20 percent of the predetermined period of time.

11. The method of claim 10, wherein the release period is at least 50 percent of the predetermined period of time.

12. The method of claim 10, wherein filtering the reference signal is performed by the adaptive filter and the release period comprises a first release period which corresponds to adaptation of the adaptive filter and a second release period which is independent of adaptation of the adaptive filter.

13. The method of claim 1, wherein the predetermined gain function disables itself at an end of the predetermined period of time.

14. The method of claim 1, wherein filtering the reference signal is performed by the adaptive filter having a first step size when applying the predetermined gain function and having a second step size when the adaptive filter is adapting and the predetermined gain function is not being applied.

15. The method of claim 14, wherein the first step size is larger than the second step size.

16. The method of claim 1, further comprising:
detecting whether a near-end signal is present in the adaptive filter system, wherein when a near-end signal is detected during applying the predetermined gain function, the predetermined gain function is not applied during a remainder of the predetermined period of time.

17. A method for detecting an abrupt change in an adaptive filter system, comprising:
receiving a desired signal generated by a communication system;
receiving a reference signal;
filtering the reference signal using an adaptive filter to provide an estimated desired signal;
generating an error signal based on the desired and estimated desired signals;
generating an output signal based on the error signal;
performing power estimations of the desired signal, reference signal, error signal, and estimated desired signal; and
based on the power estimations, detecting an abrupt change of the communication system.

18. The method of claim 17, further comprising:
in response to detecting the abrupt change of the communication system, applying a predetermined gain function to the error signal during a predetermined period of time to produce the output signal.

19. The method of claim 18, wherein the predetermined period of time comprises a speed-up period, a hang-over period, and a release period.

20. The method of claim 19, further comprising:
performing a power estimation of the output signal, wherein the power estimation of the output signal is used to maintain a target output level during the hang-over period.

21. The method of claim 20, further comprising:
selectively performing non-linear processing of the output signal, wherein the target output level has a first value when non-linear processing is performed and a second value when non-linear processing is not performed.

22. The method of claim 17, wherein detecting the abrupt change comprises:
when the power estimation of the error signal is larger than the power estimation of the desired signal, the abrupt change is detected when a minimum of the power estimation of the error signal and the power estimation of the estimated desired signal is within a first predetermined range of a maximum of the power estimation of the error signal and the power estimation of the estimated desired signal.

23. The method of claim 22, wherein the first predetermined range corresponds to 25 percent of the maximum of the power estimation of the error signal and the power estimation of the estimated desired signal.

24. The method of claim 22, wherein the first predetermined range corresponds to 10 percent of the maximum of the power estimation of the error signal and the power estimation of the estimated desired signal.

25. The method of claim 22, wherein when the power estimation of the error signal is larger than the power estimation of the desired signal, the abrupt change is detected when the minimum of the power estimation of the error signal and the power estimation of the estimated desired signal is within the first predetermined range of the maximum of the power estimation of the error signal and the power estimation of the estimated desired signal for a predetermined amount of time.

26. The method of claim 22, wherein detecting the abrupt change further comprises:
when the power estimation of the error signal is larger than the power estimation of the desired signal, the abrupt change is detected when a minimum of the power estimation of the desired signal and the power estimation of the estimated desired signal is outside a second predetermined range of a maximum of the power estimation of the desired signal and the power estimation of the estimated desired signal.

27. The method of claim 26, wherein the second predetermined range corresponds to 25 percent of the maximum of the power estimation of the desired signal and the power estimation of the estimated desired signal.

28. The method of claim 26, wherein the second predetermined range corresponds to 10 percent of the maximum of the power estimation of the desired signal and the power estimation of the estimated desired signal.

29. The method of claim 26, wherein when the power estimation of the error signal is larger than the power estimation of the desired signal, the abrupt change is detected when the minimum of the power estimation of the desired signal and the power estimation of the estimated desired signal is outside the second predetermined range of the maximum of the power estimation of the desired signal and the power estimation of the estimated desired signal for a predetermined amount of time.

30. The method of claim 26, wherein detecting the abrupt change further comprises:
when the power estimation of the error signal is less than the power estimation of the desired signal, the abrupt change is detected when the adaptive filter has converged, a minimum of the power estimation of the desired signal and the power estimation of the estimated desired signal is outside a third predetermined range of a maximum of the power estimation of the desired signal and the power estimation of the estimated desired signal, and a minimum of the power estimation of the desired signal and the power estimation of the error signal is outside a fourth predetermined range of a maximum of the power estimation of the desired signal and the power estimation of the error signal.

31. The method of claim 30, wherein the third predetermined range corresponds to 50 percent of the maximum of the power estimation of the desired signal and the power estimation of the estimated desired signal, and the fourth predetermined range corresponds to 50 percent of the maximum of the power estimation of the desired signal and the power estimation of the error signal.

32. The method of claim 30, wherein the third predetermined range corresponds to 25 percent of the maximum of the power estimation of the desired signal and the power estimation of the estimated desired signal, and the fourth predetermined range corresponds to 25 percent of the maximum of the power estimation of the desired signal and the power estimation of the error signal.

33. The method of claim 30, wherein when the power estimation of the error signal is less than the power estimation of the desired signal, the abrupt change is detected when the adaptive filter has converged, the minimum of the power estimation of the desired signal and the power estimation of the estimated desired signal is outside the third predetermined range of the maximum of the power estimation of the desired signal and the power estimation of the estimated desired signal for a first predetermined amount of time, and the minimum of the power estimation of the desired signal and the power estimation of the error signal is outside the fourth predetermined range of the maximum of the power estimation of the desired signal and the power estimation of the error signal for a second predetermined amount of time.

34. The method of claim 17, wherein detecting the abrupt change further requires:
when the power estimation of the error signal is less than the power estimation of the desired signal, the abrupt change is detected when the adaptive filter has converged a minimum of the power estimation of the desired signal and the power estimation of the estimated desired signal is outside a first predetermined range of a maximum of the power estimation of the desired signal and the power estimation of the estimated desired signal, and a minimum of the power estimation of the desired signal and the power estimation of the error signal is outside a second predetermined range of a maximum of the power estimation of the desired signal and the power estimation of the error signal.

35. The method of claim 34, wherein the first predetermined range corresponds to 50 percent of the maximum of the power estimation of the desired signal and the power estimation of the estimated desired signal, and the second predetermined range corresponds to 50 percent of the maximum of the power estimation of the desired signal and the power estimation of the error signal.

36. The method of claim 34, wherein the first predetermined range corresponds to 25 percent of the maximum of the power estimation of the desired signal and the power estimation of the estimated desired signal, and the second predetermined range corresponds to 25 percent of the maximum of the power estimation of the desired signal and the power estimation of the error signal.

37. At least one computer readable medium having stored a plurality of instructions of an adaptive filter system, the plurality of instructions for implementing the method of claim 17.

38. A method for detecting an abrupt change in an adaptive filter system, comprising:
receiving a desired signal generated by a communication system;

receiving a reference signal;
filtering the reference signal using an adaptive filter to provide an estimated desired signal;
generating an error signal based on the desired and estimated desired signals;
generating an output signal based on the error signal;
obtaining a distance between previous coefficients of the adaptive filter and current coefficients of the adaptive filter; and
using the distance to detect an abrupt change of the communication system.

39. The method of claim 38, further comprising:
in response to detecting the abrupt change of the communication system, applying a predetermined gain function to the error signal during a predetermined period of time to produce the output signal.

40. The method of claim 39, wherein the predetermined period of time comprises a speed-up period, a hang-over period, and a release period.

41. The method of claim 38, wherein using the distance to detect the abrupt change comprises:
determining a background signal level of the communication system; and
detecting the abrupt change when the distance is greater than the background signal level.

42. The method of claim 38, further comprising determining a background signal level, and wherein obtaining the distance comprises:
determining a polynomial function using the estimated desired signal level and the background signal level;
using the polynomial function to detect whether a near-end signal is present; and
selectively determining previous coefficients of the adaptive filter when the near-end signal is not detected.

43. At least one computer readable medium having stored a plurality of instructions of an adaptive filter system, the plurality of instructions for implementing the method of claim 38.

44. A method for dynamically inserting gain in an adaptive filter system, comprising:
receiving a desired signal generated by a communication system; receiving a reference signal;
filtering the reference signal using an adaptive filter to provide an estimated desired signal;
generating an error signal based on the desired and estimated desired signals;
determining a polynomial function using a power estimation of the error signal and a power estimation of the desired signal;
generating an adaptive gain function based on the polynomial function and a feedback signal; and
applying the adaptive gain function to the error signal to produce an output signal, wherein the output signal provides the feedback signal.

45. The method of claim 44, wherein generating the adaptive gain function based on the polynomial function comprises:
setting a gain adjustment rate for the adaptive gain function based on the polynomial function; and
setting a reference level for the adaptive gain function based on the polynomial function.

46. The method of claim 45, wherein when a power estimation of the output signal is less than the reference level, increasing the adaptive gain function using the gain adjustment rate and when the power estimation of the output signal is greater than the reference level, decreasing the adaptive gain function using the gain adjustment rate.

47. The method of claim 46, wherein the gain adjustment rate has a first value when increasing the adaptive gain function and has a second value when decreasing the adaptive gain function, the first value different from the second value.

48. The method of claim 46, wherein the reference level for the adaptive gain function is a function of a background signal level of the adaptive filter system.

49. At least one computer readable medium having stored a plurality of instructions of an adaptive filter system, the plurality of instructions for implementing the method of claim 44.

50. An adaptive filter system comprising:
an adaptive filter which receives a reference signal and provides an estimated desired signal; and
a gain unit which receives an error signal based on a desired signal and the estimated desired signal and provides an output signal, the gain unit applying a predetermined gain function to the error signal during a predetermined period of time that is independent of the error signal to produce the output signal.

51. The adaptive filter system of claim 50, further comprising:
an abrupt change detector coupled to the gain unit which detects an abrupt change in the desired signal, wherein the gain unit applies the predetermined gain function in response to the abrupt change detector detecting the abrupt change.

52. The adaptive filter system of claim 50, wherein the adaptive filter system is implemented as a plurality of instructions stored via at least one computer readable medium.

53. The adaptive filter system of claim 50, wherein the predetermined period of time comprises a speed-up period, a hang-over period, and a release period.

54. The adaptive filter system of claim 53, wherein at a start of the predetermined period of time, the predetermined gain function is at a first gain level, and during the speed-up period, the predetermined gain function is reduced to a second gain level.

55. The adaptive filter system of claim 54, wherein during the hang-over period, a level of the output signal is maintained at a target level.

56. The adaptive filter system of claim 55, wherein during the release period, the predetermined gain function is restored to the first gain level.

57. The adaptive filter system of claim 50, wherein the adaptive filter system is a portion of an echo canceller.

58. At least one computer readable medium for storing a plurality of instructions of an adaptive filter system, the plurality of instructions for implementing a method comprising:
receiving a desired signal and a reference signal;
filtering the reference signal to provide an estimated desired signal;
generating an error signal based on the desired and estimated desired signals; and
applying a predetermined gain function to the error signal during a predetermined period of time to produce an output signal,
wherein the predetermined gain function is independent of the error signal.

59. The adaptive filter system of claim 58, further comprising instructions for detecting an abrupt change in the desired signal, wherein applying the predetermined gain function is performed in response to detecting the abrupt change.

60. The adaptive filter system of claim 58, wherein the predetermined period of time comprises a speed-up period, a hang-over period, and a release period.

61. The adaptive filter system of claim 60, wherein at a start of the predetermined period of time, the predetermined gain function is at a first gain level, and during the speed-up period, the predetermined gain function is reduced to a second gain level.

62. The adaptive filter system of claim 61, wherein during the hang-over period, a level of the output signal is maintained at a target level.

63. The adaptive filter system of claim 62, wherein during the release period, the predetermined gain function is restored to the first gain level.

* * * * *